(12) United States Patent
Nicolaidis

(10) Patent No.: US 7,274,235 B2
(45) Date of Patent: Sep. 25, 2007

(54) ELECTRONIC CIRCUITRY PROTECTED AGAINST TRANSIENT DISTURBANCES AND METHOD FOR SIMULATING DISTURBANCES

(75) Inventor: Michel Nicolaidis, Saint Egrève (FR)

(73) Assignee: IROC Technologies, Grenoble (FR)

( * ) Notice: Subject to any disclaimer, the term of this patent is extended or adjusted under 35 U.S.C. 154(b) by 44 days.

(21) Appl. No.: 11/376,320

(22) Filed: Mar. 16, 2006

(65) Prior Publication Data
US 2006/0220716 A1    Oct. 5, 2006

(30) Foreign Application Priority Data
Apr. 5, 2005    (FR) .................................. 05 03368

(51) Int. Cl.
*H03K 3/037*    (2006.01)
(52) U.S. Cl. ...................... 327/225; 327/212
(58) Field of Classification Search ................ 327/198, 327/199, 212, 225
See application file for complete search history.

(56) References Cited
U.S. PATENT DOCUMENTS
4,525,635 A    6/1985    Gillberg 5,525,921 A *    6/1996    Callahan ...................... 327/144
6,353,341 B1*    3/2002    Lesea et al. ................... 327/34
2004/0199821 A1    10/2004    Flautner et al.
2004/0223386 A1    11/2004    Mudge et al.
2004/0239397 A1    12/2004    Mudge et al.
2004/0243893 A1    12/2004    Mudge et al.
2005/0207521 A1    9/2005    Lee et al.

FOREIGN PATENT DOCUMENTS
WO    WO 00/54410    9/2000

* cited by examiner

*Primary Examiner*—Kenneth B. Wells
(74) *Attorney, Agent, or Firm*—Oliff & Berridge, PLC

(57) ABSTRACT

The circuitry comprises successive stages, each comprising a combinatory logic circuit connected to the input of a first latch. Staggered clock signals are respectively associated with the first latches of the odd and even stages. Means for detecting a transient disturbance affecting the first latch of a stage and liable to propagate downstream, compare, in each stage, a value present on the output of the first latch of the stage considered at an observation time with a value present on the input of said first latch at a predetermined observation time taking account of the various propagation times.

23 Claims, 10 Drawing Sheets

ELECTRONIC CIRCUITRY PROTECTED AGAINST TRANSIENT DISTURBANCES AND METHOD FOR SIMULATING DISTURBANCES

BACKGROUND OF THE INVENTION

The invention relates to electronic circuitry comprising a plurality of successive stages, alternately odd and even stages, each stage comprising at least one combinatory logic circuit having at least one output connected to the input of an associated first latch, a clock signal being applied to a clock input of each first latch, the clock signal successively taking, during a clock cycle, a high level between a rising front and a descending front, and a low level from said descending front until the rising front of the next clock cycle, each first latch being transparent during the high level of the corresponding clock signal.

It also relates to a method for simulating disturbances.

STATE OF THE ART

Electronic circuits are subjected to various types of disturbances due either to their ageing or to external disturbances. These external disturbances, which can in particular be due to particle bombardments, in particular ionizing particle and neutron bombardments, can affect the dependability of any logic circuitry, more particularly in the field of nanotechnologies in which the logic transition times are becoming shorter and shorter. Reduction of the logic transition times, which can be less than the duration of a transient disturbing pulse, is increasingly leading to propagation of the disturbing pulse in the logic circuitry and to this pulse being taken into account by a latch when it coincides with the rising front of an associated clock signal. It is therefore not sufficient to provide protection against permanent faults, but it has become necessary to protect against transient disturbances as well. Moreover, it is not sufficient to protect against transient disturbances affecting only the latches, but also against those affecting the combinatory logic circuits. Consequently, known protection systems, consisting in using hardened cells for fabrication of the latches or error correction codes on output from the memory elements, are insufficient.

Document WO-A-0054410 describes a digital circuit protected against transient disturbances liable to affect the combinatory logic circuits of the circuit. It proposes in particular, as represented in FIG. 1, a circuit with duplicate latches for checking the output A of a combinatory logic circuit 1.

This monitoring circuit simply enables a transient error linked to a stray pulse to be detected. The output signals A of the logic circuit 1 are simultaneously applied to the input of a first latch 2, receiving a clock signal H, and to the input of a second latch 3, receiving a clock signal H+δ, delayed by a time δ with respect to the clock signal H. The respective output signals S and S' of the latches 2 and 3 are applied to the inputs of a comparator 4, the output signals e of which comparator are applied to the input of a third latch 5, receiving a clock signal H+δ+ε, slightly delayed, by a time ε, with respect to the clock signal H+δ applied to the second latch 3. The output signal E of the third latch constitutes an error signal indicating an error when it takes the value 1.

The chronogram of FIG. 2 illustrates operation of the circuit according to FIG. 1. In the embodiment represented, the active front of the clock signals is their rising front and the output signals A, S, S', e and E are initially at zero. A stray pulse 6 occurring on the output A of the logic circuit 1 astride a rising front of the clock signal H, taking place at a time t0, is taken into account by the first latch 2. The signal S therefore goes to 1 at the time ta. At this time, the output signal S' of the second latch is still at zero and the output signal e of the comparator 4 goes to 1.

When the second latch 3 is activated by the clock signal H+δ, at a time tb, with a time lag δ with respect to the time ta, the stray pulse 6 has disappeared and the output signal S' of the second latch remains at zero. The difference between the output signals S and S' of the latches 2 and 3 (called duplicate latches) is represented by the value 1 of the output signal e of the comparator 4. This value is taken into account by the third latch 5, at a time tc, with a time lag ε with respect to the time tb and corresponding to the rising front of the clock signal H+δ+ε. The output signal E of the third latch 5 then goes to 1, thus indicating that an error has been detected.

If, during the first clock cycle considered, i.e. before a time tc corresponding to the next rising front of the clock signal H, the output signal A of the logic circuit 1 goes to a value 1 at a time td, this value is stored by the first latch 2 at the time tc. The signal S then remains at 1. At the next rising front of the clock H+δ, at a time tf, the signal S' also goes to 1. The signals S and S' then being identical, the output e of the comparator 4 then reverts to zero. This value is taken into account by the third latch 5 at the next rising front of the clock H+δ+ε, at a time tg, and the error signal E then reverts to zero.

If there is no stray pulse at the output of the logic circuit 1, the output signals S and S' of the duplicate latches 2 and 3 are identical, except between the rising front of the clock H and the next rising front of the clock H+δ (for example between the times th and ti). This difference is not taken into account by the third latch 5 due to the time lag ε separating the rising front of the clock H+δ+ε that is applied thereto from the rising front of the clock H+δ. Thus, in FIG. 2, the signals S and S' are again identical from the time ti, and the signal e is at zero when it is taken into account by the third latch, at a time tj.

According to an alternative embodiment, the latches 2 and 3 receive the same clock signals H, but the input signals of the latch 3 have a time lag δ with respect to the input signals of the latch 2.

In the above description, a single output of the logic circuit 1 has been represented in each stage. In practice, each logic circuit 1 can be a multiple-output circuit, i.e. comprise a plurality of outputs A. In this case, sets of latches 2 and 3 are respectively associated with each output A and the comparator 4 is a global comparator comprising two inputs (S and S') for each set of latches (2 and 3). The error signal E on output of the third latch 5, connected to the output of the comparator 4, is then representative of the transients faults affecting any one of the outputs of the logic circuit 1.

As the comparator 4 of the circuitry according to FIG. 1 compares the outputs S and S' of the latches 2, 3, the monitoring circuit also detects the disturbances liable to occur in the latches. However, fine analysis of operation of circuitry with several successive stages each comprising a combinatory logic circuit 1 and a first latch 2 can enable it to be shown that certain errors produced in a latch 2 may not be detected by the monitoring circuit of FIG. 1 and may nevertheless disturb operation of the stages that follow the latch 2 affected by the disturbance. Indeed, if a disturbance modifies the output signal S of a latch 2 of a stage after the output signal e of the comparator 4 has been taken into account by the latch 5, the error on the signal S is not detected. If, on the other hand, the propagation times of the combinatory logic circuit of the following stage enable the error to be propagated to the outputs of this circuit before the occurrence of the active event of the clock which commands the latches which capture these outputs, operation of the circuit will be affected.

This problem also concerns the simulation techniques used to assess the behaviour of the circuits when faced with disturbances affecting the latches of a circuit. To assess this behaviour, these techniques modify the logic value contained in the latch affected by a disturbance and then simulate the circuit using a logic simulator. But the result of this simulation can not represent all the disturbances affecting a latch. Indeed, a logic simulation evaluates the behavior of a circuit considering signals the values whereof are fixed at logic levels throughout the clock cycle. Consequently, this simulation corresponds to a disturbance affecting a latch since the beginning of the clock cycle. But the impact on the behavior of the circuit will not be the same if the disturbance occurs later. In the latter case, depending on the time lags of the circuit located downstream from the disturbed latch, the error may, before the active event of the clock, reach only a subset of the outputs which the disturbance represented at logic level would have affected. Thus, in the case of the monitoring circuit according to FIG. 1, using current logic techniques for simulation of the transient disturbances affecting the latches of a circuit would conclude in detection of all the transient disturbances affecting the latches of the circuit whereas in reality some of these disturbances would not be detected, including disturbances resulting in incorrect operation.

OBJECT OF THE INVENTION

It is one object of the invention to improve protection of logic circuitry against transient disturbances and, more particularly, against disturbances liable to affect a latch of the circuitry.

According to the invention, this object is achieved by the appended claims and more particularly by the fact that first and second clock signals are respectively applied to the clock input of the first latches of the odd stages and of the first latches of the even stages, the first and second clock signals being offset without overlapping of their high levels, and that the circuitry comprises means for detecting a transient disturbance affecting the first latch of a stage and liable to propagate downstream, the means for detecting comprising, in each stage, monitoring means which compare:

an output value, present on the output of the first latch of the stage considered at an observation time comprised between the descending front of each cycle of the corresponding clock signal and the rising front of the next cycle of said clock signal,
with an input value, present on the input of said first latch at an observation time comprised between
a first time, that follows the previous descending front of the other clock signal by a first time interval that corresponds to a maximum propagation time of the combinatory logic circuit of said stage
and a second time, that follows the next rising front of said other clock signal by a second time interval, that is equal to the sum of a minimum propagation time of the first latch of the previous stage and of a minimum propagation time of the combinatory logic circuit of the stage considered.

Another object of the invention consists in improving the simulation techniques for the disturbances affecting the latches of the circuits. This object is achieved by performing simulation, for each latch of the circuit, of a large number of disturbances the times of occurrence whereof are staggered throughout the clock cycle and by performing these simulations using the time and functional characteristics of the circuit.

It is a further object of the invention to test electronic circuitry.

According to one feature of the invention, the circuitry comprises test means whereby, during a test phase, the first latch and the duplicate latch of a stage can be configured as scan-path type latches, test vectors can be applied to the input of the combinatory logic circuit of said stage and the outputs of the combinatory logic circuit of the next stage can be captured to transfer them to an observable point.

According to an other feature of the invention, the circuitry comprises self-test means whereby, during a test phase, the first latch and the duplicate latch of a stage can be configured on the one hand as a pseudo-random generator generating test vectors and applying them to the input of the combinatory logic circuit of said stage and, on the other hand, as a signature analysis circuit capturing the outputs of the combinatory logic circuit of the next stage and compacting them.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 4:
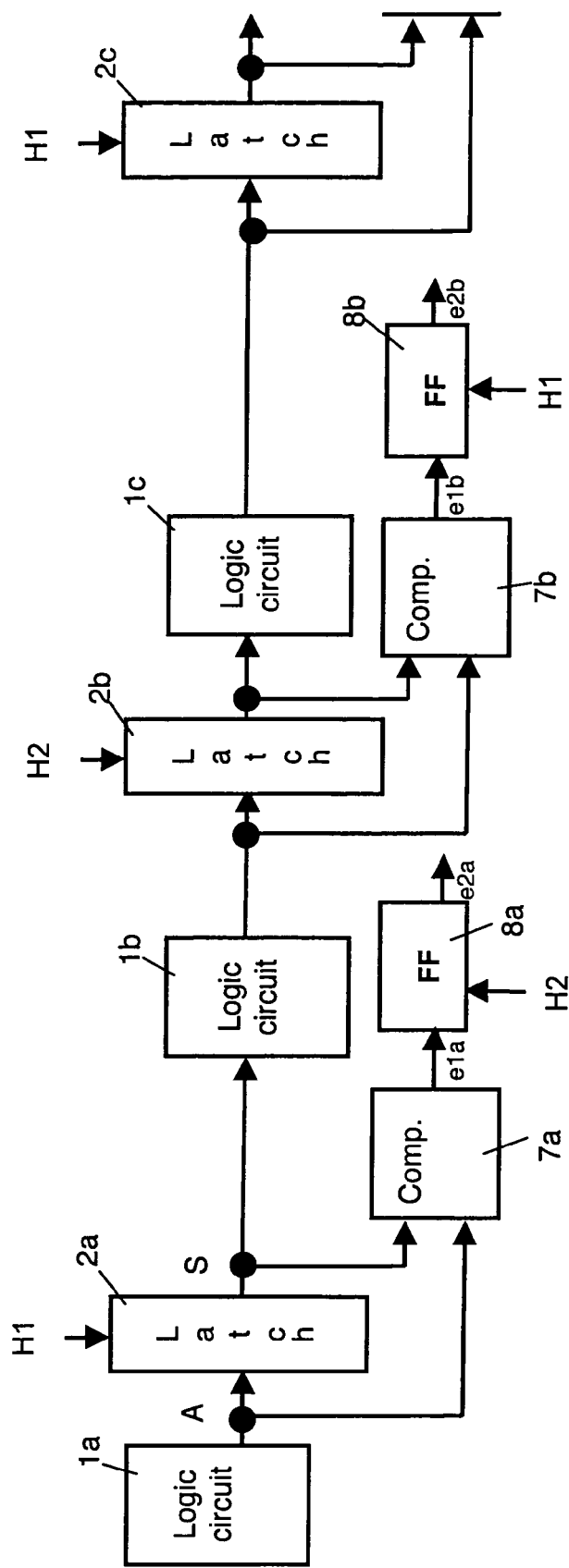
FIGS. 4 to 6 represent various embodiments of circuitry according to the invention.

The invention applies to electronic circuitry comprising, as represented in FIG. 4, a plurality of successive stages, alternatively odd and even stages. Each stage comprises at least one combinatory logic circuit 1 (1a for the first stage, 1b for the second stage, 1c for the third stage, etc . . . ) having at least one output connected to the input of an associated first latch 2 (2a for the first stage, 2b for the second stage, 2c for the third stage, etc . . . ).

In the description below, for the sake of clarity, each logic circuit has been represented with a single input, the different stages being connected strictly in series. In practice, each logic circuit can comprise several inputs and the output of a stage can, in addition, be looped back onto one of the inputs of the logic circuit of a previous stage.

Figure 3:
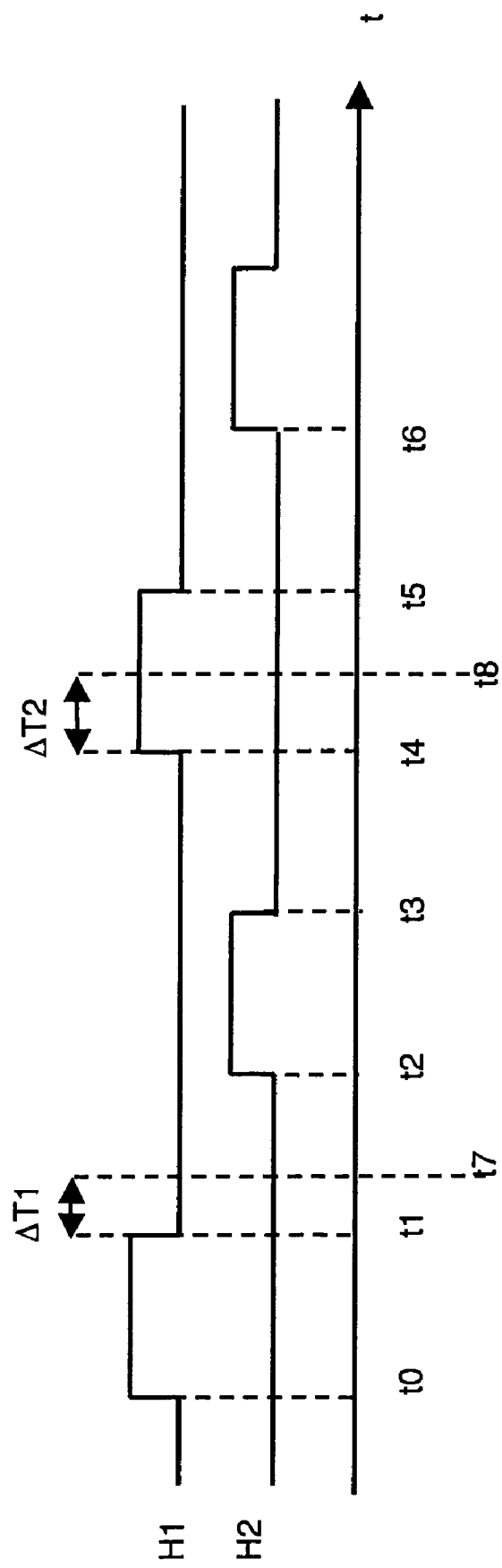
FIG. 3 illustrates the clock signals used in circuitry according to the invention and the observation periods of the input and output of a first latch of circuitry according to the invention.

As represented in FIGS. 3 and 4, first and second clock signals H1, H2 are respectively applied to a clock input of the first latches (2a, 2c) of the odd stages and of the first latches (2b) of the even stages. During a clock cycle, each clock signal (H1, H2) successively takes a high level, between a rising front (time t0 for H1 and t2 for H2) and a descending front (time t1 for H1 and t3 for H2), and a low level, from said descending front (time t1 for H1 and t3 for H2) to the rising front (time t4 for H1 and t6 for H2) of the next clock cycle. The first and second clock signals H1 and H2 are staggered without overlapping of their high levels. Thus, in FIG. 3, the times t2 and t3 (high level of a first cycle of H2) are comprised between the times t1 (descending front of a first cycle of H1) and t4 (beginning of a second cycle of H1) and the times t4 and t5 (high level of the second cycle of H1) are comprised between the times t3 (descending front of the first cycle of H2) and t6 (beginning of the second cycle of H2).

In the particular embodiment represented, each first latch 1 is transparent during the high level of the corresponding clock signal and is consequently held during the rest of the clock cycle. The data processed in the logic circuit 1a of the first stage are stored in the latch 2a of the first stage before being processed in the logic circuit 1b of the second stage. The latch 2b of the second stage stores the data processed by the logic circuit 1b before transmitting them to a next stage.

To achieve perfect protection, it is not sufficient to check the content of the latches of a stage of a circuit just after this content has been captured. This checking has to be extended to a later time of each clock cycle. This time must be such that the values of these latches do not have time to propagate through the combinatory logic circuit 1 of the next stage (for example the combinatory logic circuit 1c of the $3^{rd}$ stage when the content of the value of the first latch 2b of the $2^{nd}$ stage is checked) to reach the outputs of this combinatory logic circuit 1 before the time when these outputs are captured by the latches of this next stage. Thus, one aspect of the present invention consists in checking the outputs of the latches of a stage of a circuit, until this late time of each clock cycle.

Nevertheless, this solution has certain shortcomings. First of all, this late checking may increase the complexity of the monitoring circuit. Moreover, to run a procedure re-establishing the correct state of the circuit following detection of an error, the previous values (of the cycle before the error occurred) of a certain number of latches can be systematically stored to be used to restore correct values in response to this error detection. But if the outputs of the latches are checked very late in the clock cycle, in response to error detection, the correction phase will not be able to be activated before the end of the cycle. The circuit will therefore switch to the next state, and the values of more than one cycle will have to be systematically stored. This will increase the complexity of the correction circuit used for re-establishing the correct values.

Thus, it is a second objective of the present invention to achieve circuitry enabling error detection and correction to be performed at low cost, while taking care to maximize detection of the disturbances occurring in one stage of the circuitry and able to affect the result of the next stage.

A further objective is to apply the present invention to circuits using transparent first latches 2. Unlike master-slave latches and flip-flop (FF) latches the outputs whereof are at no time connected to the inputs thereof, such latches are transparent during a part of the corresponding clock cycle. For this reason, the transparent first latches of the successive stages are respectively controlled by two clock signals H1 and H2, without overlapping, as described hereabove. Thus, the latches of two successive stages are at no time set to transparent state simultaneously.

To perform detection of all the disturbances liable to cause errors in a circuit, the first latches 2 of a stage can be monitored up to the time when the first latches of the next stage capture the values present on their inputs. But, as indicated hereabove, it may be useful to perform this check earlier in the clock cycle. It is nevertheless necessary not to compromise detection of certain disturbances liable to induce errors.

In the following, we will call DCC (DCCmax and DCCmin respectively for the maximum and minimum) the propagation time of a combinatory logic circuit 1 of a stage (DCC1max and DCC1min for the first stage, DCC2max and DCC2min for the second stage, DCCimax and DCCimin for a stage i, etc.) and DL (DLmax or DLmin) the propagation time of a latch 2 of a stage (DL1 for the first stage, DL2 for the second stage, Dli for a stage i, etc.).

To detect a transient disturbance affecting the first latch of a stage (for example the latch 2b of the second stage) and liable to propagate downstream (to the $3^{rd}$ stage), a monitoring circuit compares, in this stage:
an output value present on the output of the first latch of the stage considered (2b of the second stage in the example considered) at an observation time (tobs)
with an input value present on the input of this first latch (2b) at an observation time (tobe).

The observation time tobs is comprised between the descending front (t3) of each cycle of the corresponding clock signal (H2, clock signal applied to the first latch 2b of the second stage) and the rising front (t6) of the next cycle of this clock signal (H2).

As for the observation time to be, it is comprised between
a first time (t7), which follows the previous descending front (t1) of the other clock signal (H1) by a first time interval ($\Delta T1$) which corresponds to a maximum propagation time (DCC2max) of the combinatory logic circuit (1b) of this stage
and a second time (t8), which follows the next rising front (t4) of this other clock signal (H1) by a second time interval ($\Delta T2$) which is equal to the sum of a minimum propagation time (DL1min) of the first latch of the previous stage (2a of the first stage) and of a minimum propagation time (DCC2min) of the combinatory logic circuit of the stage considered.

More generally, for a stage i, tobs is comprised between the leading and descending fronts of the associated clock signal and tobe is comprised between:
a first time, which follows the previous descending front of the other clock signal by a first time interval ($\Delta T1$) which corresponds to a maximum propagation time (DCCimax) of the combinatory logic circuit 1 of this stage
and a second time, which follows the next rising front of this other clock signal by a second time interval ($\Delta T2$) which is equal to the sum of a minimum propagation time (Dl(i−1)min) of the first latch 2 of the previous stage (i−1) and of a minimum propagation time (DCCimin) of the combinatory logic circuit of the stage considered.

When the circuitry comprises such a monitoring circuit in each of the stages, this choice of the observation times enables satisfactory results to be obtained at an acceptable cost.

Figure 5:
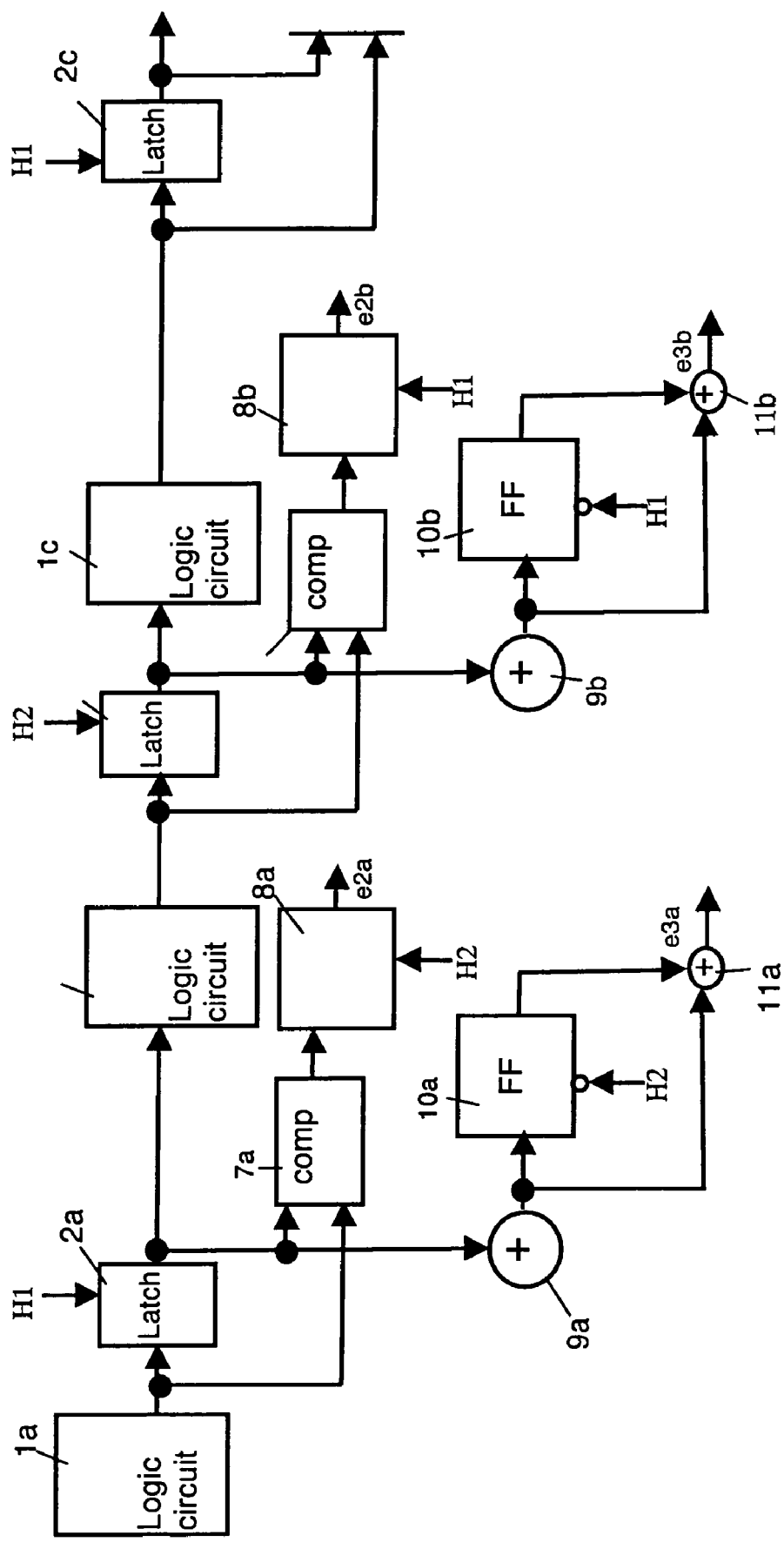
Figure 6:
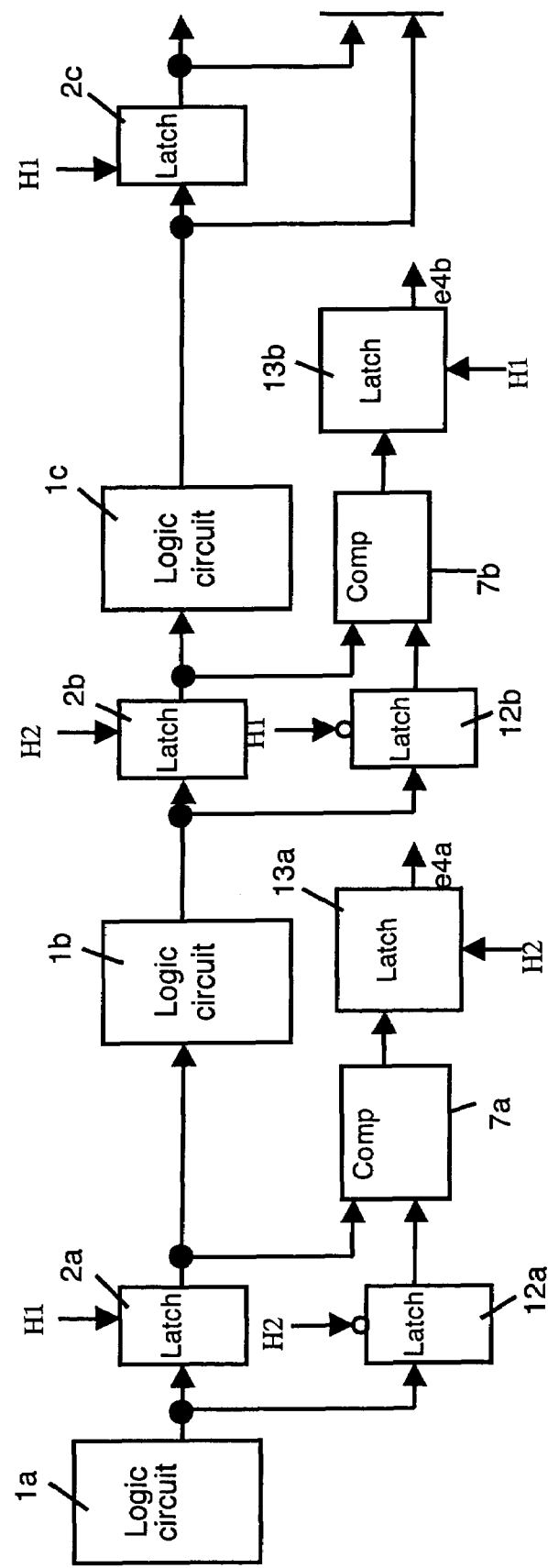

FIGS. 4 to 6 represent various embodiments of circuitry enabling such monitoring to be performed and thus enabling errors due to transient disturbances liable to affect the circuitry to be detected.

In the embodiment represented in FIG. 4, the monitoring circuit of each stage comprises a comparator 7 (7a for the $1^{st}$ stage, 7b for the $2^{nd}$ stage, etc.). The comparator 7 comprises inputs respectively connected to the input and output of the first latch 2 of the stage considered.

As before, although a single output of the combinatory logic circuit 1 is represented in each stage, in practice each combinatory logic circuit 1 can be a multiple-output circuit, i.e. comprise a plurality of outputs A. In this case, a first latch 2 is connected to each output A and the comparator 7 is a global comparator, comprising a pair of inputs associated with each first latch of the stage, the two inputs of this pair being respectively connected to the input and output of the corresponding first latch.

Thus, the comparator 7a checks the outputs of the first latches 2a of the first stage, the comparator 7b checks the first latches 2b of the second stage, etc. Each comparator thus supplies on output a first error signal e1 (e1a for the first stage, e1b for the second stage, etc.) representative of the transient faults affecting the combinatory logic circuit 1 and/or the latch 2 of the stage.

To determine at which moment checking has to be performed, let us for example consider the first latches 2b of the second stage, which are checked by the comparator 7b. For a disturbance on a first latch 2b to affect the values captured by the first latches 2c of the next stage, the disturbance must occur at the latest at a time preceding the descending front (t5) of the clock H1 by a time interval equal to DCC3min, DCC3min being the minimum propagation time of the combinatory logic circuit 1c of the third stage. Consequently, optimum protection should check the first latches 2b up to this time.

Moreover, each comparator 7 (for example the comparator 7b) has to check is the signals applied to its inputs associated with a first latch 2 (first latch 2b in the example considered) at a time when they have identical values in the absence of disturbance. In each clock cycle, the inputs of the latches 2b can be in transition for a certain time, but they always have their final value as from the descending front (t3) of the clock signal H2 where they are captured. The output values of the first latches 2b remain unchanged until the next rising front of the clock signal H2, at the time t6.

Furthermore, the values present on the outputs of the first latches 2a of the $1^{st}$ stage remain unchanged until the next rising front (at the time t4) of the clock signal H1 which makes the first latches 2a transparent and enables new values to be present on the outputs of these first latches 2a. Within a time interval equal to DCC2min, these modifications can reach the inputs of the first latches 2b of the second stage. Thus, in the example of the monitoring circuit of FIG. 4, the input and output of a first latch 2b can be compared at any time between the descending front t3 of the clock signal H2 and a time t4+DCC2min which follows the next rising front t4 of the clock signal H1. In principle, for monitoring of the first latches 2 of a stage, the propagation time of the first latches 1 of the previous stage can also be taken into account. Thus for the first latches 2b of the second stage, this comparison can be performed up to the time t8 defined hereabove (t8=t4+ΔT2, with ΔT2=DL1min+DCC2min).

The minimum propagation time DCompmin (DComp1min for the comparator 7a of the $1^{st}$ stage, DComp2min for the comparator 7b of the $2^{nd}$ stage, DCompi for a stage i, etc.) of a comparator 7 can also be taken into account to determine up to which time the output of this comparator 7 can be taken into account. Thus, for a stage of order i, if account is taken of the minimum time of the paths going from the input of the first latches 1 of the previous stage to the output of the comparator 7 of the stage of order i, i.e. passing through the first latches 1 of the stage of order (i−1), the combinatory logic circuit 1 and the comparator 7 of the stage of order i, the output of the comparator 7 of the stage of order i must be taken into account at the latest in a third time interval ΔT3=DL(i−1)min+DCCimin+DComipimin=ΔT2+DCompimin after the rising front (time t4 in the case of monitoring of the second stage) of the clock signal associated with the first latches of the stage of order (i−1).

Figure 1:
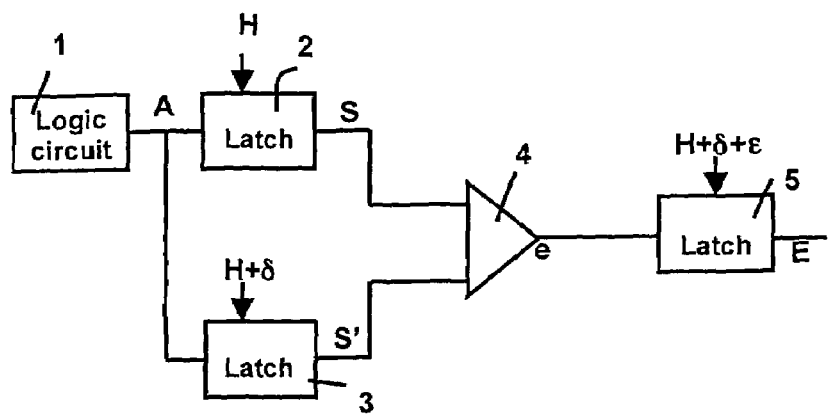
FIG. 1 schematically illustrates a monitoring circuit with duplicate latches according to the prior art.
Figure 2:
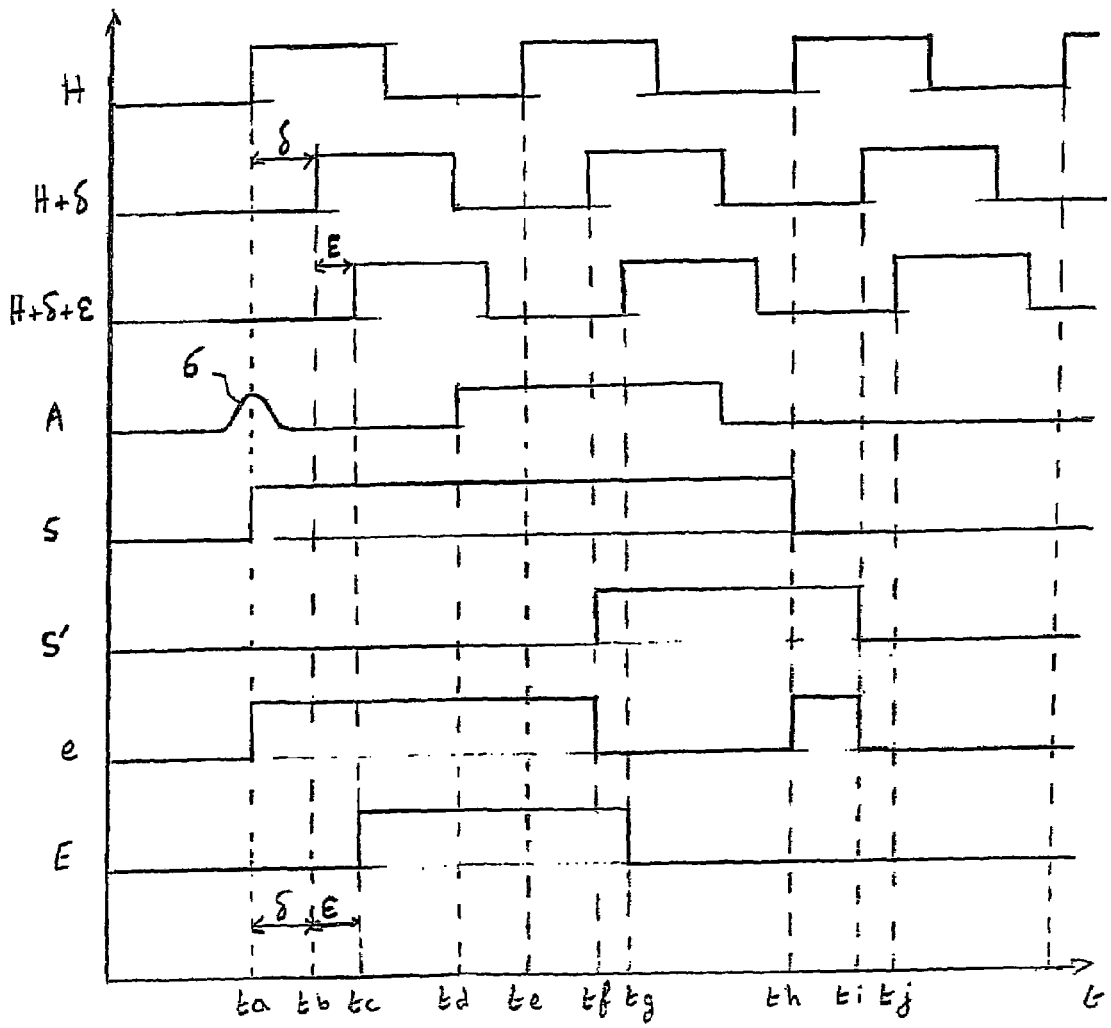
FIG. 2 represents a chronogram illustrating operation of the circuit according to FIG. 1.

The first error signal e1, obtained on output of the comparator 7, can be used to indicate error detection, to switch the circuit to a hold state and/or activate a correction phase. For this, the first error signal e1 can be processed directly by circuits dedicated to these functions (not represented in FIG. 1).

As represented in FIG. 4, the error signal e1 can also be previously captured by a first error detection latch 8 (8a for the $1^{st}$ stage, 8b for the second stage, etc.), which supplies a second error signal e2 (e2a for the $1^{st}$ stage, e2b for the second stage, etc.). Each first error detection latch 8 can be formed by a transparent latch, by a master-slave latch or by a flip-flop type latch, receiving a suitable clock signal on its clock input.

The clock signal associated with the first error detection latches 8 is chosen in such a way as to ensure capture of the output of the corresponding comparator 7 at a time which must be comprised between

- a time that follows the descending front of the clock (H1 or H2) associated with the first latch of the stage by the time interval DCompimin
- and a time that follows the rising front of the other clock (H2 or H1) by the previously defined third time interval ΔT3 (ΔT3=DL(i−1)min+DCCimin+DCompimin).

Furthermore, to detect the largest number of dangerous disturbances, this capture is preferably performed as late as possible, i.e. preferably during the third time interval ΔT3 after the rising front of the clock (H2 or H1) associated with the first latches 2 of the adjacent stages.

To reduce the complexity of the circuit as far as possible, an already existing clock is preferably used to control the first error detection latches 8. In the embodiment illustrated in FIG. 4, the clock used is the clock associated with the first latches of the adjacent stages. Thus, the first and second clock signals H1 and H2 are respectively applied to the clock inputs of the first error detection latches of the even stages (8b, etc.) and the odd stages (8a, 8c, etc.).

If the third time interval ΔT3 is longer than the duration of the high level of the clock (H1 in the case of monitoring of the second stage) associated with the first latches 2 of the adjacent stages, the output of the comparator 8 of a stage is then preferably captured at the descending front of this clock (H1 in the example considered). Protection is then perfect. Alternatively, the output of the comparator 8 can be captured, as represented in FIG. 4, on the rising front of this clock (H1 in the example considered). Although this alternative may form an acceptable compromise, certain disturbances affecting the first latches (2b in the example considered) of the stage and liable to cause errors in the first latches (2c in the example considered) of the next stage may not be detected.

The use, in a stage, of a first detection latch 8 controlled by the clock signal associated with the first latches of the adjacent stages is, in addition, very efficient to detect the transient pulses generated in the components of the combinatory logic circuit 1 of the stage and captured by the first latches 2 of the same stage. It is also very efficient for detecting timing faults. A timing fault is a permanent fault which can increase the time of one or more paths of the combinatory logic circuit 1 of the stage. Due to such a fault, the combinatory logic circuit 1 could complete computation of the value of one of its outputs at a time following, by a time interval Df, the descending front of the clock signal that controls the first latches of the stage. Indeed, as far as transient pulses are concerned, between the time when such a transient pulse is captured by the first latches 2 of this stage (descending front of the clock H2 for the second stage) and the time when the output of this first latch is effectively compared with its input (in the case of monitoring of the second stage, at a time preceding the rising front or the descending front of H1 by the propagation time Dcomp2min), any transient pulse having a duration shorter than the time separating these times will have disappeared from the inputs of the first latches 2 of the stage and will consequently be detected by the comparator 8 of the stage. For similar reasons, if the time interval Df is shorter than this time, the transient fault will be detected. The first latches 2 of a stage can be affected by a transient pulse or a timing fault affecting the combinatory logic circuit 1 of the stage only up to the descending front of the associated clock signal. It is therefore sufficient to check the outputs of these latches up to this descending front. Nevertheless, comparison will in fact be performed later so as to ensure that the fault has disappeared from the inputs of the first latches of the stage and becomes detectable by the comparator of the stage.

This detection of the disturbances affecting the circuit thus takes advantage of the characteristics of circuits using latches controlled by non-overlapping clocks and, in particular, of the fact that the outputs of the first latches 2 of a stage remain unchanged during a fairly long time interval even after the values present on their outputs have been captured by the first latches of the next stage.

The embodiment of FIG. 5 comprises the same elements as the circuitry according to FIG. 4. The output of the comparator 7 of a stage is captured by a first detection latch 8 on the rising front of the clock signal associated with the first latches of the adjacent stages (H1 is associated with 8b and H2 with 8a). Moreover, the combinatory logic circuits 1 of the circuitry according to FIG. 5 comprise a plurality of outputs and each stage comprises several first latches 2, respectively connected to the outputs of the combinatory logic circuit 1 of the stage, and the comparator 7 of the stage is then a global comparator.

The circuitry according to FIG. 5 comprises in addition, in each stage, a circuit enabling the outputs of the first latches 2 to be monitored after the output of the comparator 7 of the stage has been captured by the associated first error detection latch 8. For this, each stage in addition comprises a parity computation circuit 9 (9a, 9b, etc.) connected to the outputs of the first latches 2 of the stage. The output of this parity computation circuit 9 is connected to the input of a second error detection latch 10 (10a, 10b, etc.) controlled by the same clock (H2 for the odd stages and H1 for the even stages) as the first error detection latch 8 of the stage and captures the value present on its input on the rising front of the same clock.

In each stage, a first exclusive-OR gate 11 (11a, 11 b, etc.) comprises inputs respectively connected to the input and output of the second error detection latch 10 and supplies a third error signal e3 (e3a, e3b, etc.) on output. The first gate 11 thus compares the output of the second error detection latch 10 with the output of the parity computation circuit 9, which enables the disturbances affecting the first latches 2 of the stage after the output of the comparator 7 of the stage has been captured by the associated first error detection latch 8 to be detected.

The third error signal e3 can be used to check the output signals of the first latches 2 of the stage (stage i), up to the next rising front of the clock signal associated with the first latches of the stage, i.e. up to the beginning of the next clock cycle (for example up to the time t6 for the second stage when monitoring is performed in the cycle t2-t6 of the clock signal H2). At this moment the outputs of the first latches 2 of the stage in fact start to change, for the corresponding clock signal switches to high level and the new values present on the outputs of the first latches 2 start to propagate to the output of the first gate 11 of the stage. However, the first latches (for example 2c) of the next stage (stage i+1) are only sensitive to the disturbances occurring in the first latches (for example 2b) of the stage considered (stage i) up to the descending front (for example t5) of the other clock signal (for example H1) that precedes this rising front (t6 in the example considered), or more exactly, up to a time preceding this descending front (t5) by the minimum propagation time DCC(i+1)min of the combinatory logic circuit (1c in the example considered) of the next stage (stage i+1). The third error signal e3 can therefore only be observed up to this time.

In the particular embodiment of FIG. 6, in each stage, a duplicate latch 12 (12a, 12b, etc.) is connected between the input of the first latch 2 and the corresponding input of the comparator 7 of the stage. The inputs of the comparator 7 are thus respectively connected to the outputs of the first latch 2 and of the duplicate latch 12. The duplicate latch 12 is transparent during the low level of the clock signal associated with the first latches of the adjacent stages and is consequently held during the high level of this clock signal. Thus, as represented in FIG. 6, the duplicate latches (12a, 12c, etc.) of the odd stages are transparent during the low level of the clock signal H2, whereas the duplicate latches (12b, etc.) of the even stages are transparent during the low level of the clock signal H1.

Thus, the duplicate latches 12 capture the outputs of the combinatory logic circuit 1 of the stage considered (for example of the circuit 1b of the second stage) at a first time (t4 in the example considered) corresponding to the rising front of the clock signal (H1 in the example considered) of the first latches 2 of the adjacent stages, i.e. before the inputs of this combinatory logic circuit start to change. The inputs of the comparator 7 of the stage considered thus remain stable up to a second time, corresponding to the rising front (t6 in the example considered) of the clock associated with the first latches of the stage (H2 in the example considered) that follows this first time (t4, rising front of H1). From this second time (t6), the first latches (2b) of the stage considered become transparent. They can therefore be checked at any time up to this second time.

However, to detect all the disturbances affecting the first latches (2b) of the stage liable to produce errors in the first latches (2c) of the next stage, the outputs of the first latches (2b) of the stage considered only have to be checked until a third time (t5), corresponding to the descending front of the clock signal (H1) associated with the first latches of the adjacent stages that follows the first time (t4). Third error detection latches 13, respectively connected to the outputs of the comparators 7, can therefore ensure perfect protection if they capture the signal applied to their inputs on the descending front of this clock signal.

In the example represented in FIG. 6, the output of the comparator 7 is captured by the third error detection latch 13 (13a, 13b, etc.) on the rising front of the clock signal (H1) associated with the first latches of the adjacent stages that follows the first time (t4). This latch 13 is connected to the output of the comparator 7 and is controlled by this clock signal (H1) to supply a fourth error signal e4 on output. The third error detection latches 13 of the odd stages and of the even stages are therefore respectively controlled by the second and first clock signals (H2 and H1). This embodiment also enables perfect protection to be provided if a fourth time interval $\Delta T4 = DCC(i+1)min - DCompimax$ (for example DCC3min−DComp2max) is longer than the duration of the high level of the clock signal (H1) associated with the first latches of the adjacent stages, Dcompimax being the maximum time delay of the comparator of the stage considered and DCC(i+1)min being the minimum time delay of the combinatory logic circuit of the next stage. Should this condition not be met, protection will not be perfect, but it will nevertheless be sufficient for a large number of applications.

Like the first error detection latches of FIG. 4, the $3^{rd}$ error detection latches of FIG. 6 can be formed by a flip-flop or master-slave type latch, as well as by transparent latches receiving suitable clock signals.

Another aspect of the invention is to provide solutions enabling the correct state of the circuit to be re-established after an error has been detected.

To ensure protection only against transient pulses and timing faults affecting the combinatory logic circuit 1 (for example 1b) of an even stage, the values captured by the first latches 2 (for example 2b) of the stage can be checked on the descending front (t3) of the associated clock signal H2, before the next rising front (t4) of the clock H1 associated with the first latches (2a, 2c) of the odd stages. The correction procedure is then very simple. It consists in using the error signal of the second stage to hold the first latches of the odd stages during the high level of the clock H1 (between t4 and t5) that follows the descending front (t3) of the clock H2. This action holds the values of the previous cycle of the clock H1 in the first latches of the odd stages. In this way, on the next descending front of the clock H2, the first latches of the even stages take the correct values of the previous cycle of the clock H2.

This procedure produces correct values if hold of the even latches takes place before the rising front (t4) of the clock H1. Consequently, this procedure can correct the errors produced by any transient pulse of shorter duration than a fifth time interval $\Delta T5$ and by any timing fault causing a computing delay Df of less than $\Delta T5$, with $\Delta T5 = t4 - t3 - DCompimax - Dbl$, DCompimax being the maximum time delay of the comparator 7 (for example 7b) of the even stage considered, and Dbl the time delay of the hold circuit (not represented), that triggers hold of the first latches of the odd stages, in reaction to activation of the error signal of the even stage considered. To improve this protection, the value of the fifth time interval $\Delta T5$ can be increased, while keeping the duration of the cycle of the clock H1 constant, by decreasing the duration (t4−t3) of the high level of this clock. Correction of the odd stages is performed in like manner.

To perform detection and to trigger the correction procedure later so as to improve protection against transient pulses and timing faults affecting the combinatory logic circuits 1, and also against disturbances affecting the first latches 2, the correct state of the circuit can be re-established by storing the previous values of all or part of the first latches of the circuit in a set of redundant latches or correction latches. In this case, following detection of an error, the outputs of the correction latches are connected to the inputs of the corresponding combinatory circuits. The circuit then operates with this configuration during one clock period and the results are captured in the first latches, before the circuit is reset to its regular configuration in which the inputs of the combinatory logic circuits are again connected to the outputs of the first latches of the previous stage, and operation is continued with this configuration.

To perform this correction efficiently, a conflict has to be managed between on the one hand the need to detect an error at a late stage in order to maximize detection of dangerous disturbances liable to cause errors, and on the other hand the need to detect an error before the correction latches switch to a new state and thus lose the state necessary to correct the detected error. If this situation could arise, two redundant latch stages would have to be used so as to store the states corresponding to two successive clock cycles and to keep the state necessary to correct the detected error at a late stage.

Figure 7:
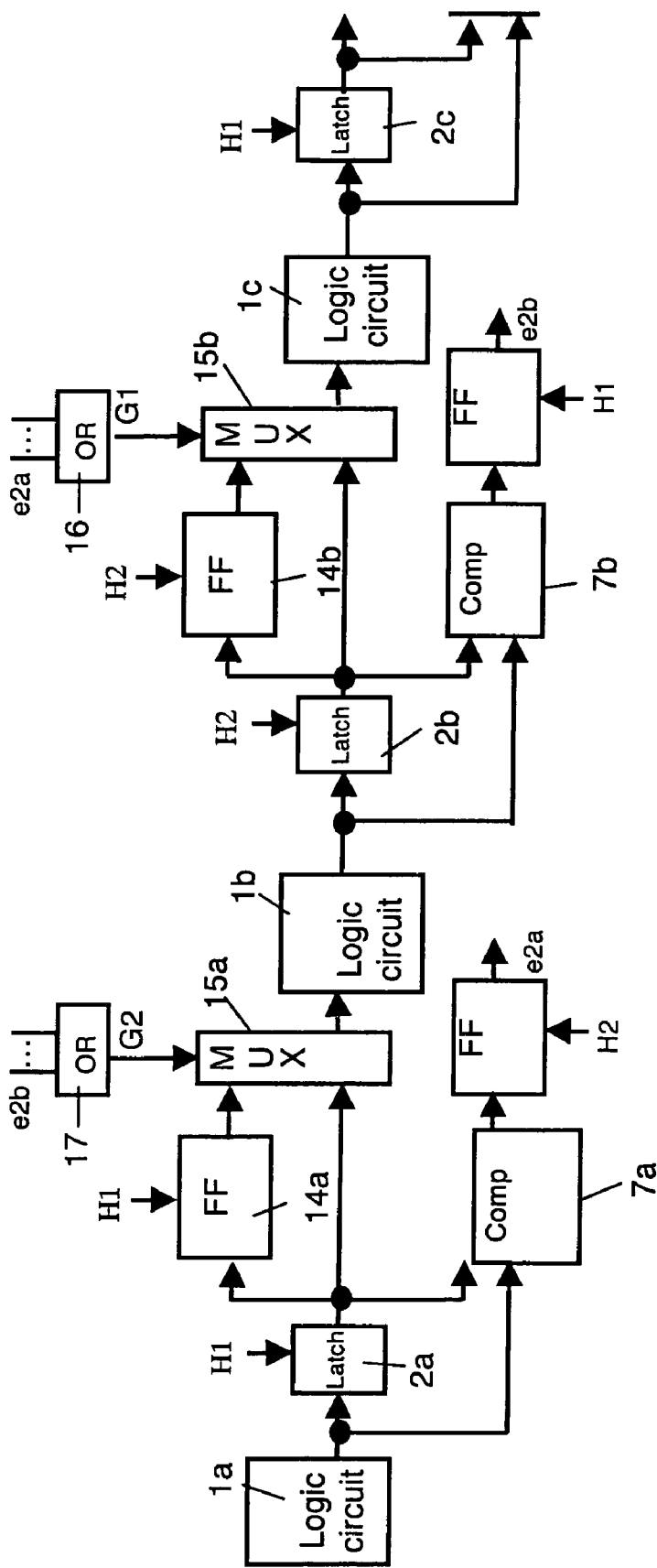
FIGS. 7 to 11 represent various embodiments of circuitry according to the invention, comprising a correction circuit.

The embodiment of the circuitry represented in FIG. 7 enables the errors detected by the circuitry according to FIG. 4 to be corrected. It differs from the circuitry according to FIG. 4 by the presence of a circuit for re-establishing the correct-states of the first latches 2. A correction latch 14, respectively even or odd, is connected to the output of each first latch 2 of the respectively even and odd stages. The correction latches 14 can be master-slave latches, as represented in FIG. 7, or flip-flop latches. In this case, they capture the values present on their inputs on the rising front of the clock signal associated with the corresponding first latch 2. The odd correction latches (14a, etc.) and even correction latches (14b, etc.) are therefore respectively controlled by the clock signals H1 and H2. In this way, they store, during a period of the clock signal H1 or H2 starting from the rising front of this clock signal, the values that the corresponding first latches 2 store up to this rising front. The correction latches 14 can also be transparent latches. These transparent correction latches, controlled by the clock signal associated with the corresponding first latches 2, are transparent during low level of this clock signal. They therefore store during low level of this clock signal the values that the corresponding first latches 2 store up to the rising front of this clock signal.

Each correction circuit in addition comprises a first multiplexer 15 (15a, 15b, etc.) comprising two inputs respectively connected to the outputs of the first latch 2 and of the corresponding correction latch 14. The output of the first multiplexer 15 is connected to the input of the combinatory logic circuit 1 of the next stage. The first multiplexers are controlled by the error signals of at least the next stage.

In the embodiment illustrated in FIG. 7, the first multiplexers of the even and odd stages are respectively controlled by a first global error signal G1 and by a second global error signal G2. The first global error signal G1 is obtained on the output of a first OR gate 16, receiving the error signals (e2a, e2c, etc) of all the odd stages on its inputs. In like manner, the second global error signal G2 is obtained on the output of a second OR gate 17, receiving the error signals (e2b, e2d, etc.) of all the even stages on its inputs.

When, as in the embodiments of FIG. 5, a stage supplies two error signals, a global error signal can alternatively take into account either one of these signals or of both of them. Thus, the first global error signal G1 can take into account all or part of the error signals (e1, e2, e3 and/or e4) of the odd stages, whereas the second error signal G2 can take into account all or part of the error signals (e1, e2, e3 and/or e4) of the even stages.

The signals applied to the multiplexer control inputs can be directly the signals G1 and G2, as represented in FIG. 7, or be supplied by a control circuit (not represented) receiving the error signals from the different stages and supplying the multiplexers with control signals in response to the signals G1 or G2.

In FIG. 7, if, for example (correction of the odd stages is performed in similar manner) the error signal e2b of the second stage is activated on account of an error on the outputs of the first latches 2b or on the outputs of the combinatory circuit 1b of the second stage, it is not known whether this error arises from the first latches or from the combinatory logic circuit. Correction of this stage, by the correction circuit (14a, 15a) arranged in the previous stage, therefore has to be activated after each activation of the signal e2b, even if the error detected does not originate from the latches 2b. When an error occurs in the latches 2b, error detection on the signal e2b is taken into account on the rising front of the clock signal H1 (or at the latest up to the descending front of the clock signal H1 if the output of the comparator 7b is taken into account at a later moment than this rising front). The error is therefore present in the first latches 2b, but it is also propagated to the first latches 2c of the third stage. The first latches 1a, and also the other first latches of the odd stages have changed or start to change their state. However, all the odd correction latches (14a, 14c, etc.) contain the state that the first latches (2a, 2c, etc.) of the corresponding odd stages store up to the rising front of the clock H1.

Correction is then performed in the following manner:

In the embodiment wherein the correction latches 14 are transparent latches, activation of the global error signal G2 holds the correction latches of the odd stages (14a, 14c) during the low level of the clock H1. In this case, the output of the comparator 7b therefore has to trigger this hold at the latest before the descending front of the clock H1. This action is not performed if the correction latches 14 are master-slave latches.

Activation of the global error signal G2 connects the outputs of the odd correction latches to the inputs of the combinatory logic circuits 1 of the even stages. At the next descending front of the clock signal H2, the first latches 2 of the even stages have reverted to their correct state of the previous cycle.

Thanks to these correct states on the next descending front of the clock signal H1, the first latches of the odd stages find the correct states of the previous cycle. The states of all the first latches therefore have the correct values with a lag of one cycle. In the meantime, the global error signal G2, that controls the multiplexers 15 of the odd stages, has gone to 0, the circuit reverts to its normal configuration and continues operating.

Reconfiguration of the circuit following activation of the global error signal G2 could add time lags that are not contained within the normal cycle of clock signals. In this case, the state of the circuit will be held during a whole period of the clock signal H1 (a high level of the clock signal H2 and a high level of the clock signal H1 will then be ignored). In this way, the time lag due to reconfiguration of the circuit following activation of the global error signal G2 will be amply compensated by giving the circuit a longer computing time than usual.

Error correction can be performed in the same way in the case of circuitry performing error detection according to FIG. 5. In this case, the first OR gate 16, supplying the first global error signal G1, can combine all the odd error signals (e2a, e3a; e2c, e3c; etc.) in a single signal. Likewise, the second OR gate 17, supplying the second global error signal G2, can combine all the even error signals (e2b, e3b; e2d, e3d; etc.) in a single signal.

Figure 8:
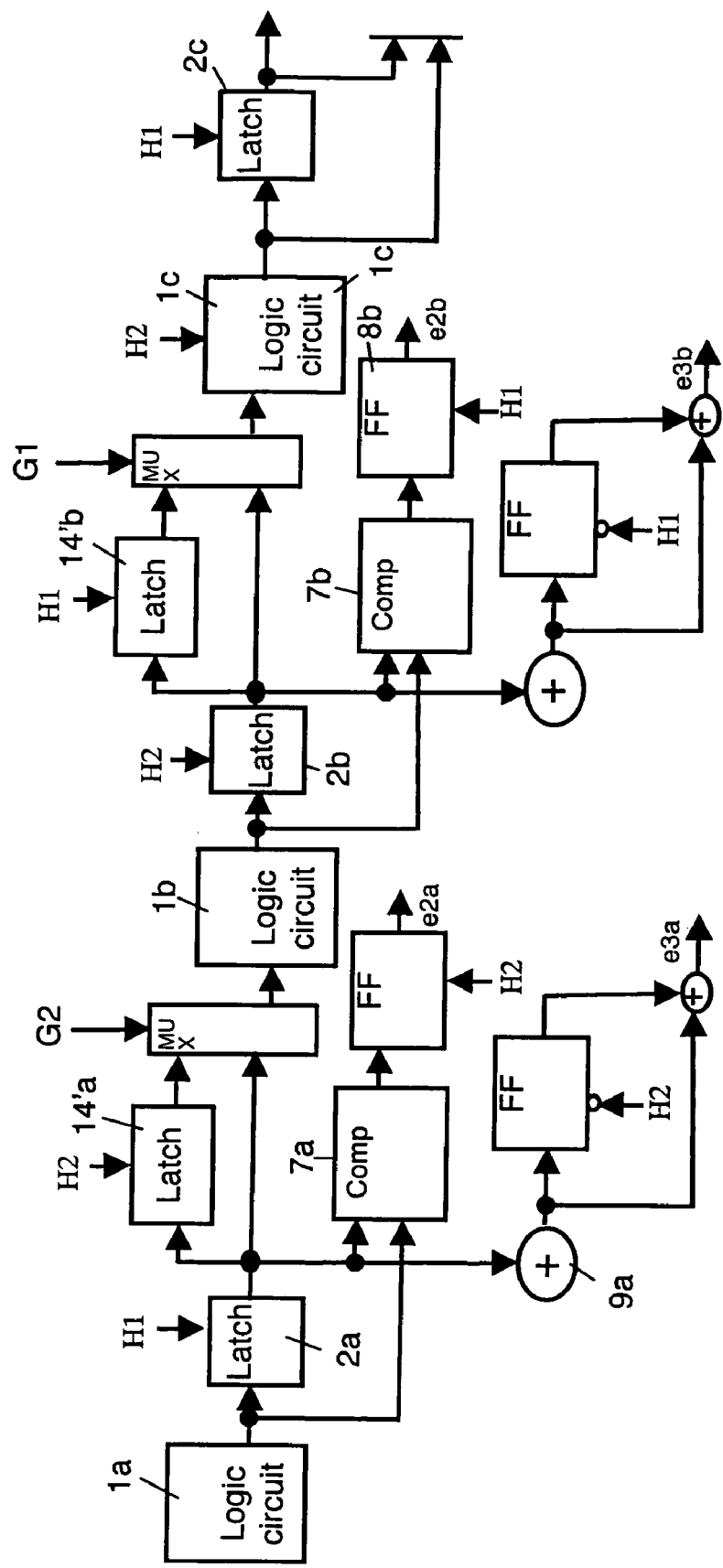

In circuitry according to FIGS. 4 and 5, the correction circuit can also use transparent correction latches 14' instead of the flip-flop correction latches 14 of FIG. 7. Such an embodiment is illustrated in FIG. 8, for circuitry according to FIG. 5. The odd transparent correction latches 14' (14'a, 14'c, etc.) and even transparent correction latches (14'b) are then respectively controlled by the second clock signal H2 and by the first clock signal H1.

Following an error detection indicated by the global error signal G2, the odd transparent correction latches (14'a, 14'c, etc.) are thus set to hold state during the next high level of the clock signal H2, so as not to be in a state of transparency at the same time as the first latches of the even stages (2b, etc). For the rest, correction is performed as in the circuitry according to FIG. 7. However, in the case of use of a correction procedure that holds the circuit during the high levels of the clock signals H2 and H1 that follow detection of an error, to accommodate with the time lags added by reconfiguration of the circuit, as described previously, the odd and even transparent correction latches are also held respectively for a second high level of the clock signals H2 and H1.

Figure 9:
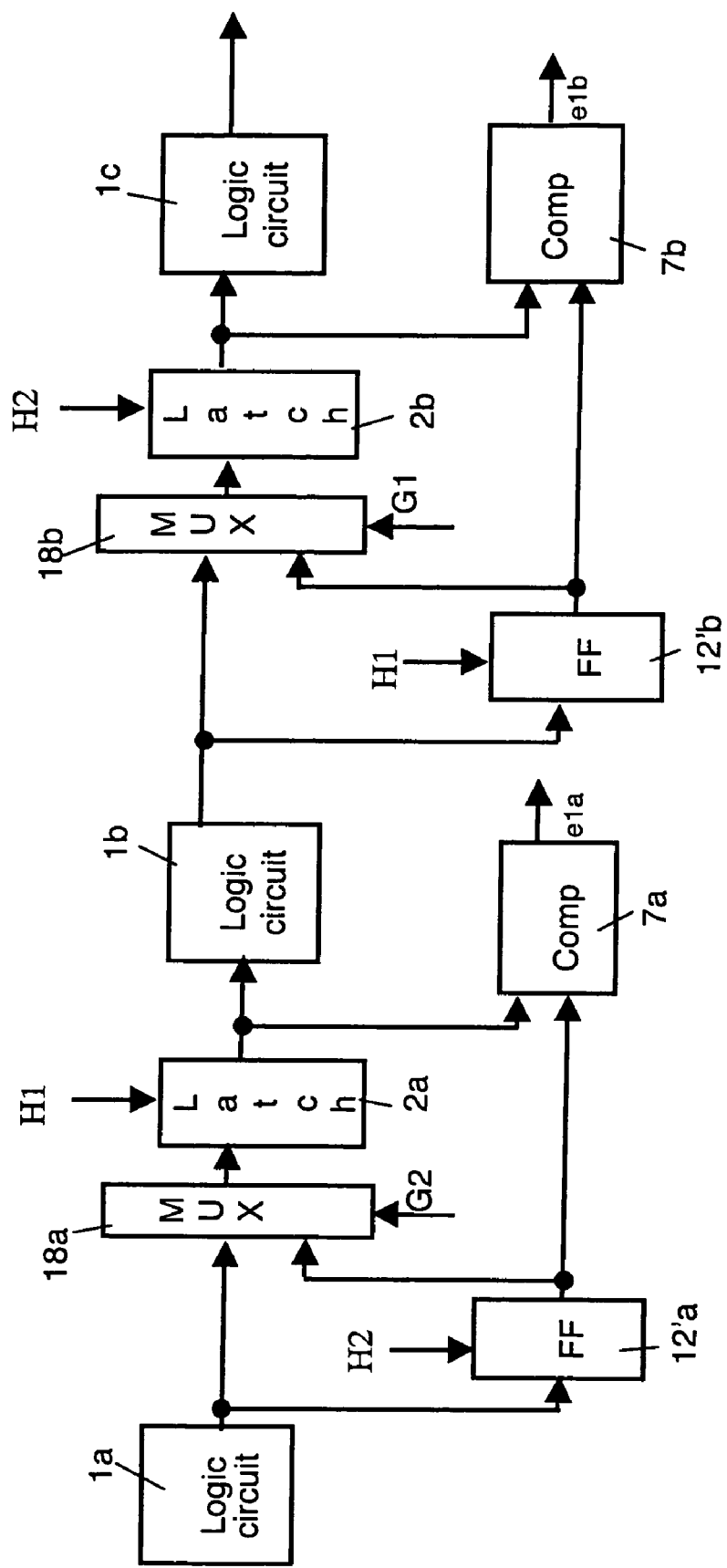

In circuitry according to FIG. 6, the duplicate latches 12 of the error detection circuit can be used to recover the states necessary to perform correction. For the duplicate latches to retain the states of the previous cycle of the first latches 2 for a sufficiently long time, the duplicate latches are then master-slave or flip-flop (FF) type latches 12', as illustrated in FIG. 9.

The inputs of the flip-flop type duplicate latches 12' of a stage are connected to the outputs of the combinatory logic circuit 1 of the stage. These duplicate latches 12' are controlled by the clock signal of the first latches of the adjacent stages and capture the outputs of the combinatory logic circuit 1 on the rising front of this clock. The duplicate latches 12' of the even and odd stages are therefore respectively associated with the clock signals H1 and H2. The correction circuit of each stage further comprises a second multiplexer 18 (18a, 18b, etc.) comprising inputs respectively connected to the outputs of the combinatory logic circuit 1 and of the duplicate latch 12'. The outputs of the second multiplexer 18 of the stage are then connected to the inputs of the first latches 2 of the stage. As in FIG. 6, the outputs of the first latches 2 of a stage are connected to the inputs of the combinatory logic circuit 1 of the next stage and a comparator 7 is connected to the outputs of the first latches 2 and of the duplicate latches 12' of the stage to supply an error signal.

As in FIG. 7, the error signals of all the even or odd stages can respectively be combined to form a global error signal G2 or G1, enabling the multiplexers 18 of the odd and even stages to be respectively controlled.

In case of error detection, the states of the duplicate latches 12' are therefore used to perform correction. But we do not know whether the error comes from the first latches 2 or from the duplicate latches 12', for the comparators 7 that compare their outputs only indicate the fact that their values are different. Using the states of the duplicate latches 12' to perform correction is therefore liable to perpetuate errors.

Separating the error signals into an even global error signal G2 and an odd global error signal G1 enables this situation to be avoided.

Correction is performed in the following manner:

For example, when the signal G2 indicates an error at the latest up to the occurrence of the descending front of the clock signal H1, this signal is taken into account by the error correction circuit. In this case, the active level of the global error signal G2 connects the inputs of the first latches (2a, 2c, etc.) of the odd stages to the outputs of the corresponding duplicate latches (12'a, 12'c, etc). The effect on operation of the circuit of the next high level of the clock signal H2 is held. This hold can be performed, as required, for all the clock signals H2 or only for those controlling the duplicate latches (12'a, 12'c, etc.) of the odd stages. Such a hold can be achieved either by keeping the clock at level 0 or by activating a hold signal (hold) that holds the change of state of the duplicate latches (12'a, 12'c, etc.) of the odd stages. This action will hold the states of these duplicate latches for the time required to perform correction. On the next descending front of the clock signal H1, the state of the duplicate latches (12'a, 12'c, etc.) of the odd stages re-establishes the correct state of the first latches (2a, 2c, etc.) of the odd stages. On the next descending front of the clock signal H2, the restored state of the first latches (2a, 2c, etc.) of the odd stages re-establishes the correct state of the regular first latches (2b, etc.) of the even stages. In the meantime (for example on the rising front or on the descending front of the clock signal H2), the signal G2 is reset to 0 and the circuit reverts to its normal configuration and continues its operation.

Figure 10:
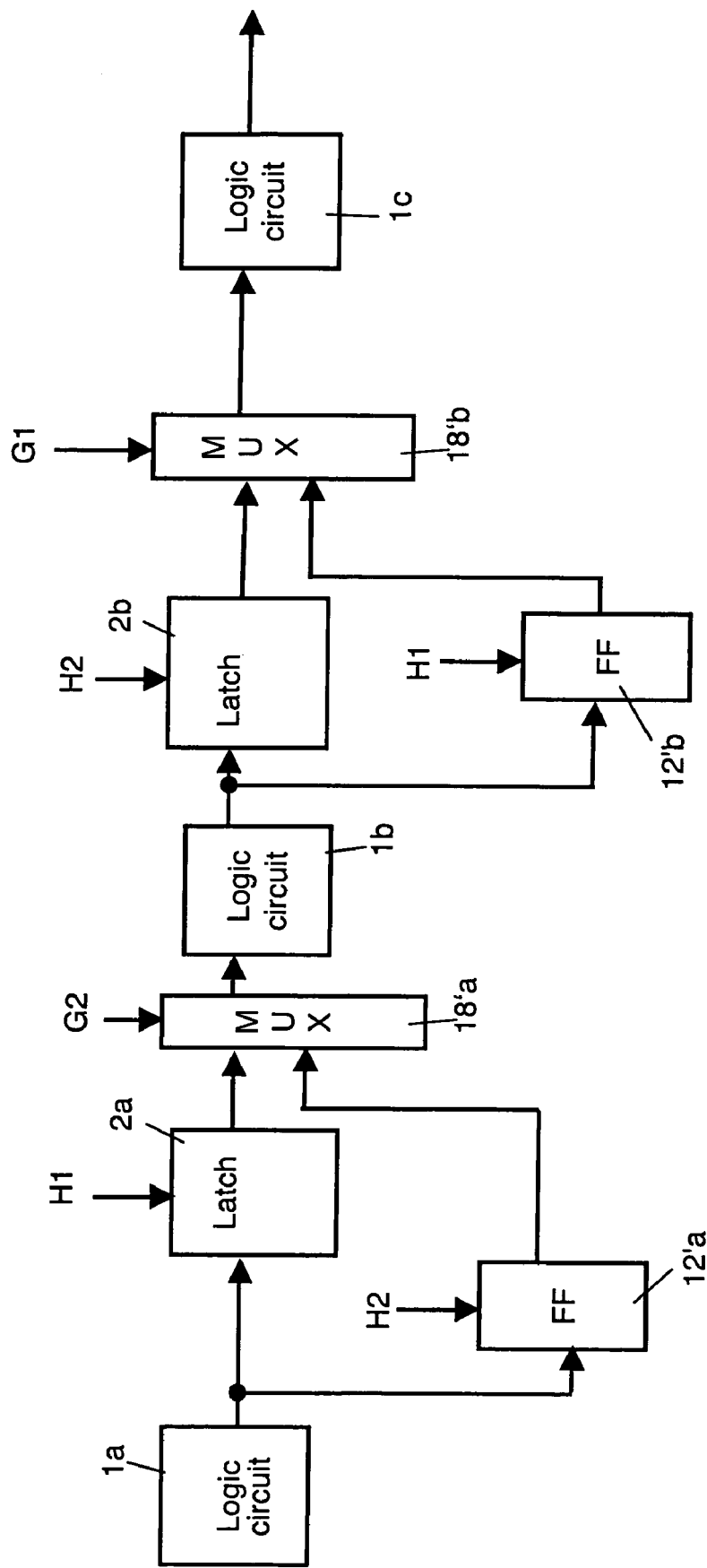

The circuitry according to FIG. 10 only differs from that according to FIG. 9 by the respective locations of the multiplexer and of the first latch of a stage. In FIG. 10, the second multiplexer 18' of a stage is connected between the output of the corresponding first latches and the inputs of the combinatory logic circuit 1 of the next stage.

Great care must be taken in setting up the error correction circuits described hereabove in order to enable error detection during a hold phase, if the first latches 2 can be held during one or more cycles, by means of a hold signal (hold) that acts on a dedicated input of the first latches or that holds in a fixed state the clocks that control them. In this case, to be able to check the content of the latches that are in a hold state, the corresponding duplicate latches 12' also have to be held. For example, in FIG. 9, if the first latches 2 of the even stages are held by holding the state of the clock signal H2 at 0 or by activating their hold signal (hold) before the clock signal H2 goes to 1, then the duplicate latches 12' of the even stages will be held not enabling their states to change on the next rising front of the clock signal H1. For their operation to be resumed, the hold of the first latches (2b, etc.) of the even stages will be released letting their states change during the high level of a cycle of the clock signal H2 and the duplicate latches of the even stages will change their states on the next rising front of the clock signal H1. In this way, the first latches (2b, etc) and the duplicate latches (12'b) will always have identical states at the time they are checked by the corresponding comparator (7b), including during the hold phase of the first latches (2b).

This solution also applies in circuitry according to FIG. 6 using transparent duplicate latches 12 instead of the master-slave or flip-flop type duplicate latches 12'. In this case as well, hold of the first latches and of the duplicate latches will be performed in the order described hereabove.

As far as the circuitry according to FIG. 4 is concerned, which circuitry does not comprise any duplicate latches, it is not necessary to worry about the order in which their state is held. But in this case, the state of the first latches can not be checked during their hold state. This solution can therefore not be applied in circuits enabling the state of their first latches to be held, except to accept not to check these states during their hold period. Nevertheless, if hold of the first latches of a stage i is always preceded by hold of the first latches of the stage (i−1) that precedes it, then the solution of FIG. 4 can be used for error detection in the stage i. For the stages in which this situation is not verified, the solutions of FIG. 6 or 7 will have to be used to perform error detection in the first latches of these stages. The solution of FIG. 5 on the other hand enables error detection to also be performed for these stages. For this, during the hold phase, the third error signal e3 of the stage i will be used to check the first latches of this stage, whereas the first and second error signals of the stage will be ignored. To perform this check, the second error detection latch 10, containing the parity of a set of first latches, will be held after a hold of these first latches. The hold will be able to be released, either immediately before or immediately after the hold of these first latches has been released. This solution can be applied in all the stages that use parity checking according to FIG. 5, without having to worry about whether the other stages of the circuit are held or not, or about the order in which they are held.

These embodiments will be used to obtain good protection against disturbances affecting the first latches 2. To achieve protection only against timing faults and transient pulses affecting the combinatory logic circuits 1, these embodiments will not be of any use, for these faults do not affect the first latches 2 during their hold phase. This observation also concerns the error correction modes used during the hold phase, described herebelow.

The existence of the hold cycles can also cause problems for the error correction procedure. In the case of FIG. 9, for example, let us assume that all the first latches 2 of the circuitry go to hold state, in the following order: first latches of the even stages according to the clock signal H2 (i.e. changing of their state during the high level of the clock signal H2 is disabled), then first latches of the odd stages according to the clock signal H1. The hold order of the duplicate latches 12' is determined by the hold order of the first latches, as described hereabove. Thus, for all of the first latches 2 and duplicate latches 12', the hold order will be: first latches (2b, etc.) of the even stages during the high level of a cycle of the clock signal H2, then duplicate latches (12'b, etc.) of the even stages on the next rising front of the clock signal H1, and first latches (2a, 2c, etc.) of the odd stages during the high level of H1, then duplicate latches (12'a, 12'c, etc.) of the odd stages on the next rising front of H2. Resumption of operation will take place in the same order: change of state of the first latches (2b, etc.) of the even stages during the high level of a cycle of H2, change of state of the duplicate latches (12'b, etc.) of the even stages on the rising front of H1 and of the first latches (2a, 2c, etc.) of the odd stages during the high level of H1, then change of state of the duplicate latches (12'b, etc.) of the odd stages on the rising front of H2.

In this situation, if an error is detected during the hold phase, it will no longer be possible to use the content of the duplicate latches 12'a to restore the correct state of the first latches 2b, for the state of the duplicate latches 12'a will be equal to the state of the first latches 2a, which are one clock cycle ahead with respect to the state of the first latches 2b. But correction of the state of the latches 2b is not necessary if the only use of a correct state of the first latches 2b is to compute the state of the first latches 2c of the next stage (which was already done before the hold). In this case, there is no need to trigger error correction. As indicated hereabove, on resumption of operation, it is the first latches of the even stages that change their values first. Their incorrect state therefore disappears without inducing any errors in other latches.

In the rarer case where the first latches 2b are used by other circuits than the first latches 2c of the next stage, their state will have to be corrected. If this is the case, to restore the correct state of the first latches 2b, it will be necessary to determine whether the error detected by the error signal e1b comes from the first latches 2b. If this is the case, the state of the duplicate latches 12'b will be correct and will be able to be used to restore the state of the first latches 2b by activating the control signals of the multiplexers 18b to connect the output of the duplicate latches 12'b to the inputs of the first latches 2b, and by activating the clock H2 of the first latches 2b during one cycle.

Figure 11:
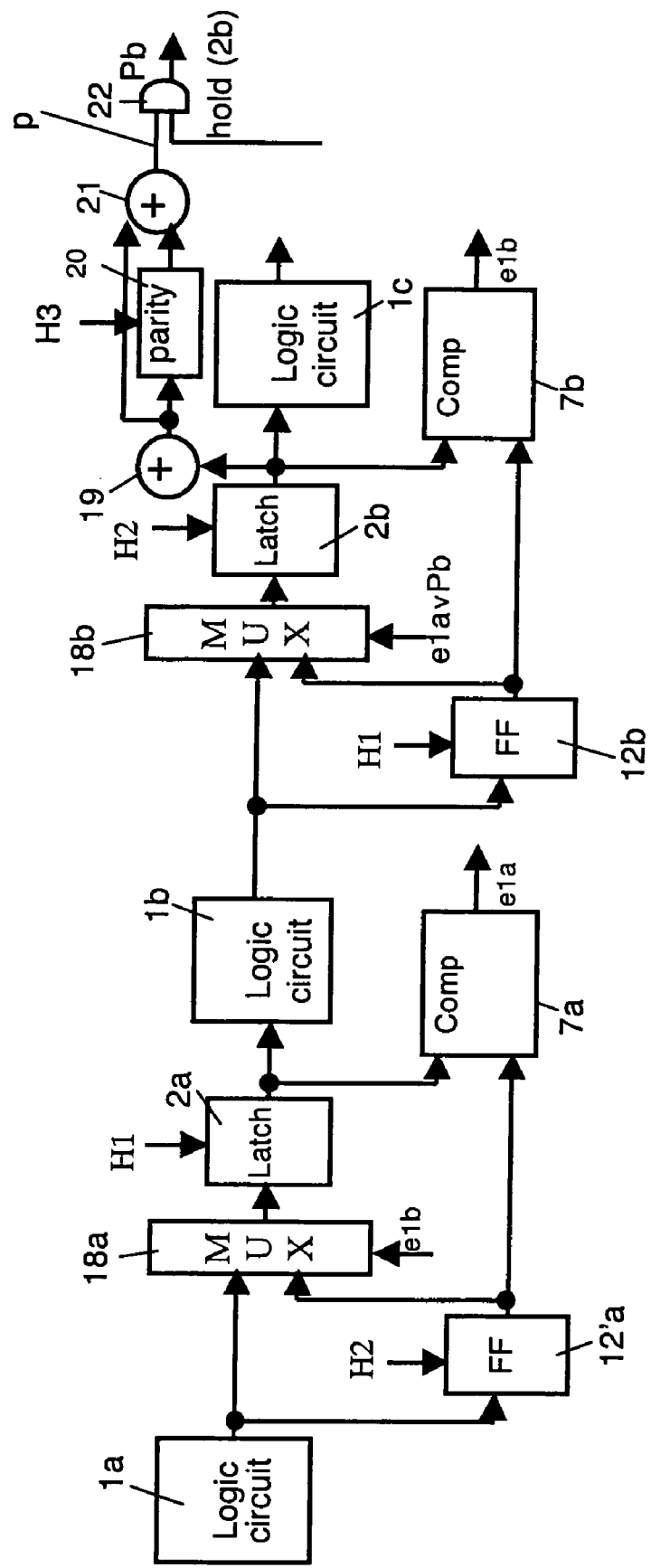

To be able to locate the source of errors, an additional parity circuit 19 computes the parity of the first latches 2b and stores it at the beginning of each hold period in a parity latch 20, as represented in FIG. 11. The parity latch 20 is controlled by a clock signal H3 that is held during the time period during which the first latches 2b are held. The parity latch 20 can, for example, be a master-slave type latch which captures the value present on its input on the rising front of the clock signal H3. The latter can be formed by a logic AND between the clock signal H1 and the complement of the hold signal (hold) of the first latch 2b, i.e. H3=(H1)AND(NOThold). The output of the parity latch 20 is compared with the output of the additional parity computation circuit 19, in a second exclusive OR gate 21 which generates a parity check signal p (pb for the second stage) having the value 1 when the parity of the first latches 2b is incorrect. To validate this parity check signal p during the hold phase of the first latches only, an AND gate comprises two inputs respectively receiving the hold signal (hold) and the parity check signal p. The AND gate 22 supplies a valid parity check signal P on output. The valid parity check signal Pb of the second stage and the error detection signal e1a of the first stage are combined by a logic OR gate (not represented) to generate a control signal (e1avpb) of the multiplexer 18b and trigger the correction procedure described hereabove.

This correction procedure applies to each even stage. In order not to use a management circuit of this procedure for each even stage, the first global error signal G1, representative of the errors detected in the odd stages, is combined (OR function) with a global valid parity check signal P0 to generate a control signal of the multiplexers of all the even stages and trigger the correction procedure described hereabove in all the even stages. The signal P0 is generated using an OR gate (not represented) that receives on these inputs the valid parity check signals (Pb, Pd, etc.) of all the even stages.

As far as correction of the state of the first latches 2c of the third stage is concerned, it can be noted that the duplicate latches 12'b of the second stage contain, during the hold period, values enabling their state to be restored. The solution of FIG. 9 can consequently be used for the first latches 2c of the 3$^{rd}$ stage and also for all the first latches (2a, 2c, etc.) of the odd stages. Thus, for the first latches of the odd stages, no additional parity computation circuit 20 is necessary.

Let us now consider the case where, for circuitry according to FIG. 9, hold is performed on all the first latches in the following order: first latches of the odd stages according to the clock signal H1 (i.e. their change of state during the high level of the clock signal H1 is disabled), then first latches of the even stages according to the next clock signal H2. For all the first latches 2 and duplicate latches 12', the hold order will be: first latches (2a, 2c, etc.) of the odd stages during the high level of a cycle of H1, then duplicate latches (12'a, 12'c, etc.) of the odd stages on the next rising front of H2 and first latches (2b, etc.) of the even stages during the high level of H2, then duplicate latches (12'a, 12c, etc.) of the odd stages on the next rising front of H2. Resumption of operation will take place in the same order: change of state of the first latches (2a, 2c, etc.) of the odd stages during the high level of a cycle of H1, then change of state of the duplicate latches (12'a, 12c, etc.) of the odd stages r on the next rising front of H2 and of the first latches (2b, etc.) of the even stages during the high level of H2, then change of state of the duplicate latches (12'a, 12'c, etc.) of the even stages on the next rising front of H1. In this case, error correction will be performed as in the previous case, the only difference being that the roles of the even and odd stages are swapped over. In this case, there will no longer be any need for an additional parity computation circuit for the even stages, but only for the odd stages.

In the case where the hold order of the even and odd stages is not always the same, an additional parity computation circuit 20 will have to be used in the even stages and in the odd stages. But this will not be necessary in all situations, as for example in the stages in which the state of the first latches is only used to compute the state of the first latches of the next stage. As pointed out in the above, in this case it is then not necessary to correct the state of these first latches each time hold begins by these first latches and is continued by hold of the first latches of the next stage and release of the hold is performed in the same order. Furthermore, when hold of these first latches follows hold of the first latches of the stage that precedes them and release of the hold is performed in the same order, then the additional parity computation circuit is no longer necessary either, as correction of the state of these first latches can be performed using the first latches of the previous stage. As there are two possible correction options, the hold order must be stored each time in order to be able to choose one or the other of these options depending on the case. Nevertheless, hold and release must always respect one or the other of these conditions to be able to do without the parity computation circuit.

The use of a parity computation circuit 20 will always be necessary for the first latches of a stage, if these first latches can be held without the first latches of the previous stage being held.

In the case of the circuit of FIG. 8, correction management during hold phases is much simpler. Indeed, as in the circuit of FIG. 5, checking of the first latches 2 during the hold phase is performed using only the 3$^{rd}$ error signals and ignoring the other error signals. In this case, the state of the correction latches 14' is not used during the hold phase to check the first latches 2. These latches can therefore be held so that they contain values useful for correcting the errors detected in the first latches 2 by the 3$^{rd}$ error signals. For example, if the first latches (2b, etc.) of the even stages are held, the odd correction latches (14'a, 14'c, etc.) will be held at the same time. If during the hold period an error is detected by the third error signal (e3b, etc.) originating from checking of the parity of a set of even first latches, correction is performed in the same way as outside the hold period. The only difference is that, in this case, the first latches of the circuit being held, they will be released during the cycles necessary for performing correction. Likewise, hold of the first latches ($2a$, $2c$, etc.) of the odd stages and of the even correction latches ($14'b$, etc.) is performed at the same time. In case of error detection by the third signals e3a, e3c, etc, correction is performed in the same way as for the error signals e3b, etc.

To cope with timing faults, the detection and correction circuits provide protection against faults that do not delay computing of the combinatory logic circuit 1 by one stage beyond a time interval $\Delta T5$ following the descending front of the clock signal associated with the first latches of the stage, $\Delta T5$ being determined by the error detection or correction embodiment adopted. But downgrading of operation of a circuit, due for example to its ageing, can further increase these delays. To prevent this downgrading from causing large time delays in the circuit that are not detectable and/or correctable by the detection and correction means, according to one embodiment of the present invention, an error detection frequency of occurrence analysis circuit (not represented) can be used. This analysis circuit takes account of the error signal activations of the circuit and checks whether their frequency verifies certain pre-established criteria. It checks, for example, whether the number of these activations within a given time interval exceeds a certain value. If, at a given time, the analysis circuit ascertains that the pre-established criterion is not respected, it induces reduction of the frequency of the clock signals by a preset factor, for example by a given percentage of their current frequency or by a preset frequency rate.

A last object of the invention consists in improving the techniques for simulating disturbances affecting the first latches of the circuits. To achieve this object the invention uses a time-based simulator (not represented) that takes into account the path times of the combinatory logic circuit 1 separating the first latches of a stage from the first latches of the next stage. This type of simulation determines, for example, the arrival times of a transition at the first latches ($2b$) of the second stage from the time when this transition occurs on a first latch ($2a$) of the first stage and the path times of the combinatory logic circuit ($1b$) connecting the first latch ($2a$) affected by the disturbance with the first latches ($2b$) of the second stage. For example, if a modification modifies the state of a first latch at a time tp of a clock cycle, if a path of time delay D connects the output of this first latch to a first latch of the next stage and if this path propagates the modification of the state of the first latch to the input of the first latch of the next stage, then, the modification will reach the input of this first latch of the stage at the time tp+D. This propagation will take place only if each logic gate of the above-mentioned path propagates the modification. However, a logic gate propagates on its output a modification occurring on one of its inputs if its other inputs have appropriate logic values. An inverter therefore always propagates a modification of the value of its input. A modification propagates from the input of an OR gate or of a NOT-OR gate to its output, if the values of its other inputs are equal to 0. A modification propagates from the input of an AND gate or of a NOT-AND gate to its output if the values of its other inputs are equal to 1. A path composed of a set of logic gates of a combinatory logic circuit connected in series in such a way that these gates fulfil the conditions described above and thereby successively propagating a modification occurring on the input of this path one after the other, is called a sensitized path. If the time tp+D takes place between the time tp and the time, following tp, in which the first latch of the next stage captures the values present on its inputs, an incorrect value will be captured by this first latch of the next stage. If the first two latches are connected by means of several sensitized paths, there will be a combination of several propagations of the modification of the state of the first latch. If the inversion parity of each of these paths (i.e. the parity of the number of inverting gates situated on each of these paths) is equal to a preset value (0 or 1), none of these propagations can cancel the effects of the others. In this case, the time tp+D to be considered to determine whether there is an error captured by the first latch of the next stage is the time tp+Dmin corresponding to propagation of the modification via the sensitized path having the shortest time period. If on the other hand the inversion parities are not equal, certain propagations of the initial modification may modify the effect of certain others. Therefore, if all the inputs of an OR gate (or of a NOT-OR gate), the correct value whereof is equal to 1, are connected with the output of the disturbed first latch by sensitized paths of even (respectively odd) inversion parity, then their value will be modified to 0 and the value of the output of the gate will be inverted. But if other sensitized paths of odd (respectively even) inversion parity connect the output of the disturbed latch with certain of the other inputs of the gate, the value of these inputs will be modified from 0 to 1 and the output of the gate will revert to its correct value. The propagations of the modification via the second paths therefore cancel the effect of the propagations of the modification via the first paths. In spite of this cancelling, the output of the gate could take an incorrect value within certain time intervals, depending on the time periods of the different sensitized paths. The same analysis can be applied in the case of an AND gate or of a NOT-AND gate, if the correct values 0 and 1 of the inputs of the gate are interchanged. The simulation thus uses the time at which a disturbance takes place on a first latch, the correct logic state of the circuit, and the time delays of the sensitized paths connecting the output of the disturbed first latch to the input of a first latch of the next stage, to determine whether an error is captured by the latter latch.

The simulation will in this way be able to determine which are the first latches that will capture errors at the time of the active event of the clock. To assess the impact of the disturbances affecting a latch in a given clock cycle, the simulation circuit inputs a predetermined certain number of logic transitions on the output of the first latch distributing these transitions throughout the clock cycle. For example, if the correct value of a latch is 0, it is changed to 1, but the beginning of this change is distributed throughout the clock cycle using a constant time period. Each of these disturbances is simulated to determine whether this propagation induces errors on the first latches that are connected to the outputs of the next stage and which are the first latches affected.

The result of this simulation can subsequently be used in a logic simulator to simulate propagation of these errors in the next stages of the circuit and to determine the impact of the disturbance on operation of the whole circuit. In other cases, it is only used to establish statistics (percentage of disturbances affecting the latches that produce errors) without proceeding with other simulations. If the circuit uses checking circuits to detect disturbances, time-based simulation will also show whether each transition affecting a first latch of a stage is detected by the checking circuit. By combining this result with the result showing whether there are any errors affecting the latches of the next stage, it is possible to determine whether all the disturbances producing errors are detected and, if this is not the case, the percentage of those that are.

Another object of the invention concerns testing of circuitry.

The complexity of modern integrated circuits does in fact make them difficult to test if they are attempted to be tested by applying test stimuli on their external inputs and observing the responses to these stimuli on their external outputs. Because of these difficulties, Design For Testability (DFT) approaches and Built-In Self-Test (BIST) solutions have been developed. DFT type techniques modify the master-slave type latches of a circuit so as to enable them to be converted into scan-path registers during the test phase.

Thus, to test a buried unit of a complex circuit, the input latches of this unit are configured as a scan-path register (that may be part of a larger scan-path register chain). A test stimulus is then applied to the inputs of the buried unit. Its response is captured in the output latches of this unit and the output latches of this unit configured as a scan-path register (often forming part of a larger scan-path register chain). This response is transferred to an observable point of the circuit.

The self-test techniques (BIST) modify the input latches of a buried unit as a test stimulus generator. This generator can, for example, be a pseudo-random generator, known under the name of linear feedback-shift register (LFSR). This circuit consists of a scan-path register the input of the first cell whereof is connected to the output of a linear logic function having as inputs the outputs of a selected set of cells of this scan-path register. During the test phase, this generator applies test stimuli to the buried unit. At the same time, the output latches of the buried unit are transformed into a compacting circuit of the outputs produced by the buried unit in response to these stimuli. This circuit, called signature analyzer circuit, also consists of a linear feedback-shift register (LFSR) circuit. But, to perform compacting of the output responses of the buried unit, the LFSR circuit is modified so that each input of a cell of the LFSR circuit is connected to the output of an exclusive-OR (XOR) gate with two inputs, the first input whereof being connected to the output of the previous cell of the LFSR circuit and the other input being connected to an output of the buried unit.

DFT and BIST techniques also apply to circuits using master-slave latches, is for scan-path registers require the use of such latches. Circuits using transparent latches are therefore not suited to this type of techniques.

An embodiment of the present invention consists, in test mode, in configuring the first latches 2 and/or the duplicate latches 12 (FIG. 6) or 12' (FIG. 9) or the correction latches 14 (FIG. 7) of the circuitry as a scan-path register chain. For example, in the second stage of the circuitry according to FIG. 6, each pair formed by a first latch 2b and duplicate latch 12b is configured as a master-slave latch. To perform this configuration, the input of the first latch 2b is disconnected from the output of the combinatory logic circuit 1b of the first stage and is connected to the output of the duplicate latch 12b. Furthermore, the clock signal H2 is connected instead of the clock signal H1 on the clock terminals of the duplicate latches 12b. These modifications configure each pair of transparent latches 2b and 12b as a master-slave latch sensitive to the rising front of the clock signal H2. The duplicate latch 12b becomes the master part of this latch and the first latch 2b becomes its slave part. The set of master-slave latches thus achieved are configured as a chain of scan-path registers and are activated by the associated clock signal to apply test stimuli to the inputs of the combinatory logic circuits or to transfer the response of a combinatory logic circuit to an observable point. The master-slave latches formed by the pairs of latches 2a, 12a can thus for example be configured as a scan-path register (which may form part of a larger scan-path chain) and be activated by the clock signal H1 to apply a test stimulus to the inputs of the combinatory logic circuit 1b. The clock signal H2, which controls the master-slave latches composed by the pairs of transparent latches 2b, 12b, is then activated once to capture the response of the combinatory logic circuit 1b in these latches. These latches are then configured as a scan-path chain and are activated by the clock signal H2 the necessary number of times to transfer this response to an observable point.

In circuitry according to FIG. 7, in test mode, the master-slave type correction latches 14a can be configured as a scan-path chain to apply the test stimuli to the inputs of the multiplexer 15a. The control signal (G2) of the multiplexer 15a is set to 1 to apply these stimuli to the inputs of the combinatory logic circuit 1b. The latches 2b then capture the responses of this circuit and these responses are then loaded on the master-slave correction latches 14b. The master-slave correction latches 14b are configured as a scan-path chain to transfer these responses to an observable point.

In circuitry according to FIG. 8, each pair formed by a transparent first latch 2b and a transparent correction latch 14'b is transformed into a master-slave latch, the latch 2b whereof is the master part and the latch 14'b is the slave latch. Transformation is performed by applying the clock signal H2 to the clock terminals of the latches 14'b, instead of the clock signal H1, and applying the complement of the clock signal H2, instead of the clock signal H2, to the clock terminals of the latches 2b. The other latches are modified in similar manner and testing is performed in the same way as in the previous case.

In circuitry according to FIG. 9, the transparent first latches 2 and the duplicate master-slave latches 12' can be combined to carry out very good quality tests. The duplicate master-slave latches 12'a are configured as scan-path chains to apply the test stimuli to the inputs of the multiplexer 18a. The control signal (G2) of the multiplexer 18a is set to 1 to apply these stimuli to the inputs of the transparent first latches 2a. Each test stimulus is applied in series by activating the clock signal H2 a certain number of times. During this time, the clock signal H1 can be held at 0. In this way, the transparent first latches 2a keep the previous stimulus throughout this time. Once the new stimulus is applied, the clock signal H1 is released. On the rising front of this clock the first latches 2a become transparent and the stimulus is applied to the inputs of the combinatory logic circuit 1b. On the next rising front of the clock signal H1, the response of the combinatory logic circuit 1b is captured by the duplicate master-slave latches 12'b. These latches are then configured as a scan-path chain to transfer this response to an observable point. This configuration is advantageous, for it makes it possible to carry out quality tests and, in particular, tests able to detect timing faults, which is not possible with the most usual scan-path chains. These timing faults require pairs of suitable test stimuli to be applied to the combinatory logic circuit 1b enabling transitions able to detect timing faults to be produced on the inputs of the combinatory logic circuit 1b. Application of such pairs becomes possible in the configuration described hereabove, for this configuration makes it possible to keep the previous stimulus unchanged in the first latches 2a while the new stimulus is applied to the duplicate latches 12'a. Then, activation of the clock signal H1 enables the transitions corresponding to this pair of stimuli to be performed on the inputs of the combinatory logic circuit 1b and enables the timing faults for which this pair was chosen to be detected.

The invention claimed is:

1. Electronic circuitry comprising a plurality of successive stages, alternately odd and even stages, each stage comprising at least one combinatory logic circuit having at least one output connected to the input of an associated first latch, a clock signal being applied to a clock input of each first latch, the clock signal successively taking, during a clock cycle, a high level between a rising front and a descending front, and a low level from said descending front until the rising front of the next clock cycle, first and second clock signals being respectively applied to the clock input of the first latches of the odd stages and of the first latches of the even stages, the first and second clock signals being offset without overlapping of their high levels, and the circuitry comprising means for detecting a transient disturbance affecting the first latch of a stage and liable to propagate downstream, the means for detecting comprising, in each stage, monitoring means which compare:

an output value, present on the output of the first latch of the stage considered at an observation time comprised between the descending front of each cycle of the corresponding clock signal and the rising front of the next cycle of said clock signal, with an input value, present on the input of said first latch at an observation time comprised between a first time, that follows the previous descending front of the other clock signal by a first time interval that corresponds to a maximum propagation time of the combinatory logic circuit of said stage and a second time, that follows the next rising front of said other clock signal by a second time interval, that is equal to the sum of a minimum propagation time of the first latch of the previous stage and of a minimum propagation time of the combinatory logic circuit of the stage considered.

2. Circuitry according to claim 1, wherein each first latch is transparent during the high level of the corresponding clock signal.

3. Circuitry according to claim 1, wherein the monitoring means of a stage comprise a comparator, comprising two inputs, associated with each first latch of the stage and respectively connected to the input and output of said first latch, and supplying a first error signal on output.

4. Circuitry according to claim 3, wherein the output of the comparator of a stage is connected to an input of a first error detection latch capturing the value present on its input in response to the clock signal associated with the first latches of the adjacent stages and supplying a second error signal on output.

5. Circuitry according to claim 3, wherein a plurality of first latches being respectively connected to a plurality of outputs of the associated combinatory logic circuit of a stage, the comparator of the stage comprises a plurality of first inputs, respectively connected to the inputs of the plurality of first latches, and a plurality of second inputs, respectively connected to the outputs of the plurality of first latches, the monitoring means in addition comprising a parity computation circuit connected to the outputs of the first latches of the stage and comprising an output connected to an input of a second error detection latch which captures the value present on its input on the descending front of the clock signal associated with the first latches of the adjacent stages, a first gate, of the exclusive-OR type, having inputs respectively connected to the input and output of the second error detection latch and supplying a third error signal on output.

6. Circuitry according to claim 3, wherein the monitoring means of a stage comprise a duplicate latch connected between the input of the first latch and the corresponding input of the comparator, the duplicate latch being transparent during the low level of the clock signal associated with the first latches of the adjacent stages.

7. Circuitry according to claim 3, comprising, for each stage, correction means controlled by at least one error signal of at least the next stage and comprising a correction latch having an input connected to the output of the first latch of the stage and a multiplexer comprising two inputs, respectively connected to the outputs of the first latch and of the correction latch, and an output connected to the input of the combinatory logic circuit of the next stage.

8. Circuitry according to claim 7, wherein the correction latch is a master-slave latch which captures the value present on its input on the rising front of the clock signal associated with the first latches of the stage.

9. Circuitry according to claim 7, wherein the correction latch is transparent during the high level of the clock signal associated with the first latches of the adjacent stages.

10. Circuitry according to claim 7, wherein the correction latch of a stage is transparent during the low level of the clock signal associated with the first latches of the stage.

11. Circuitry according to claim 1, wherein the monitoring means of a stage comprise a duplicate latch, of master-slave type, connected to the output of the combinatory logic circuit of the stage, and a comparator comprising inputs respectively connected to the output of the first latch and to the output of the duplicate latch and supplying an error signal on output, and the duplicate latch captures the value present on its input on the rising front of the clock signal associated with the first latches of the adjacent stages.

12. Circuitry according to claim 6, wherein the output of the comparator of a stage is connected to an input of a third error detection latch capturing the value present on its input in response to the clock signal associated with the first latches of the adjacent stages and supplying a fourth error signal on output.

13. Circuitry according to claim 11, comprising, for each stage, correction means controlled by at least one error signal of at least the next stage and comprising a multiplexer comprising two inputs, respectively connected to the outputs of the combinatory logic circuit and of the duplicate latch of the stage, and an output connected to the input of the first latch of the stage.

14. Circuitry according to claim 11, comprising, for each stage, correction means controlled by at least one error signal of at least the next stage and comprising a multiplexer comprising two inputs, respectively connected to the outputs of the first latch and of the duplicate latch of the stage, and an output connected to the input of the combinatory logic circuit of the next stage.

15. Circuitry according to claim 7, wherein the detection means comprise means for producing a first global error signal when an error is detected by at least one odd stage and a second global error signal when an error is detected by at least one even stage, the multiplexers of the odd stages being controlled in response to the second global error signal and the multiplexers of the even stages being controlled in response to the first global error signal.

16. Circuitry according to claim 6, comprising, for each stage, means for holding the latches of the stage, and wherein, if the state of the first latch of the stage is held during one or more cycles of the clock signal of the first latch of the stage, the means for holding comprise means for holding and for releasing the state of the duplicate latch of the stage on the rising fronts of the cycles of the clock signal associated with the first latches of the adjacent stages that follow the cycles of the clock signal of the first latch of the stage, from which the state of the first latch of the stage is respectively held and released.

17. Circuitry according to claim 16, wherein a plurality of first latches being respectively connected to a plurality of outputs of the associated combinatory logic circuit of a stage, the monitoring means in addition comprise a parity computation circuit connected to the outputs of the first latches of the stage and comprising an output connected to an input of a parity latch, a second exclusive-OR gate having inputs respectively connected to the input and output of the parity latch and supplying a parity check signal on output, and an AND gate having inputs respectively connected to the output of the second exclusive-OR gate and to an output of control means supplying a hold signal of the state of the first latch of the stage considered, the output of the AND gate being connected to an input of the control means which supply control signals, in response to activation of the output of the AND gate during a hold phase of the state of said first latch, for controlling multiplexers of the correction circuit in order to connect the output of said first latch to the output of the duplicate latch and signals to release hold of said first latch of the stage during a cycle of the corresponding clock signal, so as to correct the state of the first latch of said stage.

18. Circuitry according to claim 6, comprising test means enabling the first latch and the duplicate latch or the correction latch of a stage to be configured as scan-path type latches, during a test phase, test vectors to be applied to the input of the combinatory logic circuit of said stage and the outputs of the combinatory logic circuit of the next stage to be captured to transfer these outputs to an observable point.

19. Circuitry according to claim 6, comprising self-test means enabling the first latch and the duplicate latch or the correction latch of a stage to be configured, during a test phase, on the one hand as a pseudo-random generator generating test vectors and applying the latter to the input of the combinatory logic circuit of said stage and, on the other hand as a signature analysis circuit capturing the outputs of the combinatory logic circuit of the next stage and compacting them.

20. Circuitry according to claim 3, comprising correction means controlled by the error signals of the even and odd stages, wherein, in response to error detection by the error signal of an even stage, the correction means hold the first latches of the odd stages during the next high level of the clock signal associated with the first latches of the odd stages, and wherein, in response to error detection by the error signal of an odd stage, the correction means hold the first latches of the even stages during the next high level of the clock signal associated with the first latches of the even stages.

21. Circuitry according to claim 1, comprising an error detection frequency analysis circuit receiving error signals of the even and odd stages on input, analyzing the time characteristics of these error signals and activating a reduction of the frequency of the clock signals associated with the first latches of the even and odd stages each time these time characteristics do not verify certain predetermined criteria.

22. Method for simulating disturbances affecting the latches of electronic circuits comprising a plurality of successive stages, each stage comprising at least one combinatory logic circuit having at least one output connected to the input of an associated first latch, a clock signal being applied to a clock input of each first latch and taking a high level and a low level during a clock cycle, the value present on the input of a latch during a leading or descending front of its clock, constituting the beginning of the clock cycle, being captured by the cell, said method determining whether a disturbance modifying the value of a disturbed first latch from any time produces an error captured by a first latch of the next stage at the beginning of the next cycle of its clock, and using:

the time at which the disturbance occurs on said disturbed first latch, the correct logic state of the circuit, and the time periods of sensitized paths connecting the output of said disturbed first latch to the input of said first latch of the next stage to determine whether an error is captured by the latter latch.

23. Method for simulating according to claim 22, wherein the simulation system inputs a predetermined number of logic transitions on the output of said disturbed first latch distributing them throughout the clock cycle.

* * * * *